(12) United States Patent
Kumagai et al.

(10) Patent No.: US 6,982,465 B2
(45) Date of Patent: Jan. 3, 2006

(54) SEMICONDUCTOR DEVICE WITH CMOS-FIELD-EFFECT TRANSISTORS HAVING IMPROVED DRAIN CURRENT CHARACTERISTICS

(75) Inventors: Yukihiro Kumagai, Tsuchiura (JP); Hiroyuki Ohta, Tsuchiura (JP); Fumio Ootsuka, Ome (JP); Shuji Ikeda, Kodaira (JP); Takahiro Onai, Kokubunji (JP); Hideo Miura, Tsuchiura (JP); Katsuhiko Ichinose, Ome (JP); Toshifumi Takeda, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 11 days.

(21) Appl. No.: 10/433,786

(22) PCT Filed: Dec. 6, 2001

(86) PCT No.: PCT/JP01/10692

§ 371 (c)(1),
(2), (4) Date: Jun. 6, 2003

(87) PCT Pub. No.: WO02/47167

PCT Pub. Date: Jun. 13, 2002

(65) Prior Publication Data

US 2004/0075148 A1 Apr. 22, 2004

(30) Foreign Application Priority Data

| Dec. 8, 2000 | (JP) | 2000-379785 |
| Jun. 25, 2001 | (JP) | 2001-191612 |
| Nov. 8, 2001 | (JP) | 2001-342667 |

(51) Int. Cl.
*H01L 29/76* (2006.01)

(52) U.S. Cl. .............. 257/369; 257/384; 257/412; 257/413

(58) Field of Classification Search ............... 257/369, 257/382, 384, 412, 413
See application file for complete search history.

(56) References Cited

U.S. PATENT DOCUMENTS

| 4,660,062 A | * | 4/1987 | Nishizawa et al. ......... 257/345 |
| 5,234,850 A | * | 8/1993 | Liao .......................... 438/231 |
| 5,567,642 A | | 10/1996 | Kim et al. |
| 5,936,300 A | | 8/1999 | Sasada et al. |
| 6,091,121 A | | 7/2000 | Oda |

FOREIGN PATENT DOCUMENTS

| JP | 60-052052 | 3/1985 |
| JP | 64-000757 | 1/1989 |
| JP | 06-232170 | 8/1994 |
| JP | 07-032122 | 2/1995 |
| JP | 7038103 | 2/1995 |

(Continued)

OTHER PUBLICATIONS

A. Hamada et al., "A New Aspect of Mechanical Stress Effects in Scaled MOS Devices", IEEE Transactions on Electron Devices, vol. 38, No. 4, Apr. 1991.

*Primary Examiner*—Gene M. Munson
(74) *Attorney, Agent, or Firm*—Antonelli, Terry, Stout and Kraus, LLP

(57) ABSTRACT

The present invention provides a semiconductor device including n-channel field effect transistors and p-channel field effect transistors all of which have excellent drain current characteristics.

In a semiconductor device including an n-channel field effect transistor 10 and a p-channel field effect transistor 30, a stress control film 19 covering a gate electrode 15 of the n-channel field effect transistor 10 undergoes film stress mainly composed of tensile stress. A stress control film 39 covering a gate electrode 15 of the p-channel field effect transistor 30 undergoes film stress mainly caused by compression stress compared to the film 19 of the n-channel field effect transistor 10. Accordingly, drain current is expected to be improved in both the n-channel field effect transistor and the p-channel field effect transistor. Consequently, the characteristics can be generally improved.

16 Claims, 23 Drawing Sheets

U.S. PATENT DOCUMENTS

| | | |
|---|---|---|
| JP | 7066296 | 3/1995 |
| JP | 8288280 | 11/1996 |
| JP | 10-092947 | 4/1998 |
| JP | 11-340337 | 12/1999 |
| JP | 11345947 | 12/1999 |
| JP | 2000-036567 | 2/2000 |
| JP | 2000-036605 | 2/2000 |
| JP | 2000-058668 | 2/2000 |
| JP | 2000-174136 | 6/2000 |
| JP | 2000174136 | 6/2000 |
| JP | 2000-183182 | 6/2000 |
| JP | 2000183182 | 6/2000 |
| JP | 2000216377 | 8/2000 |
| JP | 2000-216377 | 8/2000 |
| JP | 2000-243854 | 9/2000 |
| JP | 2001-024468 | 1/2001 |
| JP | 2001-160594 | 6/2001 |
| KR | 1996-0039280 | 11/1996 |

* cited by examiner

APPEARANCE OF STRESS       APPEARANCE OF STRESS
CONTROL FILM 193           CONTROL FILM 393

SEMICONDUCTOR DEVICE WITH CMOS-FIELD-EFFECT TRANSISTORS HAVING IMPROVED DRAIN CURRENT CHARACTERISTICS

TECHNICAL FIELD

The present invention relates to a semiconductor device, and in particular, to a semiconductor device having a complementary field effect transistor composed of n-channel field effect transistors and p-channel field effect transistors.

BACKGROUNG ART

Owing to the recent development of information communication equipment, higher performance is required of semiconductor devices such as LSIs year by year, and efforts are being made to increase the operating speed of transistors. In particular, complementary field effect transistors composed of n-channel field effect transistors and p-channel field effect transistors are commonly used because of their lower power consumption. The increase in the operating speed of these transistors is achieved by making their structures finer, and is supported by an advanced lithography technique for processing semiconductor elements.

However, recently required minimum machined dimension (the minimum machined dimension of gates) are equal to or smaller than the wavelength of light used for lithography, so that it is becoming difficult to make the structures further finer.

Thus, JP-A-11-340337 specification discloses a method based on the fact that the mobility (effective mass) of electrons varies when a silicon crystal is distorted. This method provides silicon germanium, which has a larger lattice constant than silicon, as an underlying film forming a field effect transistor, and then allows a silicon layer to epitaxially grow on this underlying film to distort the silicon, which constitutes a channel portion, to increase the mobility, thereby increasing the speed of the transistor.

Further, JP-A-6-232170 specification discloses a method of controlling delays in the rise of a drain current by controlling the stress of a gate electrode of a field effect transistor.

DISCLOSURE OF THE INVENTION

For recent semiconductor devices, efforts are being made to increase the operating speed of field effect transistors. One of the means for accomplishing this purpose is to use a silicon germanium material, which has a larger lattice constant than silicon, as an underlayer for the silicon to distort the silicon, thereby increasing its mobility.

However, when the silicon layer is allowed to epitaxially grow so as to align the lattices of the materials having different crystal lattice constants as in JP-A-11-340337 specification, the distortion occurring in the crystal may have such high energy that the crystal is dislocated if it has a critical or larger thickness. The introduction of silicon germanium, which is not common to fabrication processes for semiconductor devices such as LSIs, leads to an increase in costs associated with the installation of new manufacture apparatuses.

Further, a complementary field effect transistor is composed of an n-channel field effect transistor using electrons as carriers and a p-channel field effect transistor using holes as carriers. To increase the speed of semiconductor devices, the operating speed of each of the n- and p-channel types is preferably increased.

Further, JP-A-6-232170 specification, dealing with transistors made of compound semiconductors, is insufficient because transistors formed on a silicon substrate and currently mainly used for LSIs, DRAMs, or the like are not considered, because the field effect transistors of this application are only of the n-channel type, and because stress is only uniaxially controlled.

As described above, for semiconductor devices such as LSIs, it is essential to increase the operating speed of transistors, but the lithography technique has already been improved almost to its limits. Further, although attempts are being made to improve drain current using methods other than finer structures, these methods may disadvantageously cause crystal defects or increase costs because of the need to introduce new fabrication apparatuses.

It is an object of the present invention to effectively implement a semiconductor device having n-channel field effect transistors and p-channel field effect transistors all of which have excellent drain current characteristics.

The inventors measured the dependency of drain current on stress in a field effect transistor to clarify that n-channel field effect transistors have a stress dependency different from that of p-channel field effect transistors.

In this specification, silicon nitride is denoted as SiN, and silicon oxide is denoted as $SiO_2$.

FIG. 2 is a graph showing the results of experiments on the stress dependency of drain current in n-channel field effect transistors and p-channel field effect transistors.

The results shown in FIG. 2 were obtained by carrying out stress load experiments on transistors formed on an Si (001) face so that drain current flows parallel to a <110> axis. Evaluated field effect transistors had a gate length of 0.2 µm. Further, the stress included channel-face uniaxial stress parallel to drain current flowing through a channel in the field effect transistor (stress parallel to the channel), and channel-face uniaxial stress perpendicular to the drain current (stress perpendicular to the channel). A positive stress symbol denotes tensile stress, and a negative stress symbol denotes compression stress.

In FIG. 2, for the n-channel field effect transistor, the drain current increases consistently with the tensile stress (for the stress parallel to the channel, about 4%/100 MPa and for the stress perpendicular to the channel, about 2%/100 MPa).

On the other hand, the inventors confirmed that for the p-channel field effect transistor, the drain current increases consistently with the stress perpendicular to the channel (about 4%/100 MPa), whereas it decreases consistently with the stress parallel to the channel (about 7%/100 MPa).

These results also indicate that if channel-face biaxial stresses are applied to the n-channel field effect transistor, the drain current increases consistently with the tensile stress regardless of the absolute value and that if the same stresses are applied to the p-channel field effect transistor, the drain current increases consistently with the compression stress if biaxial stresses having the same absolute value act on the transistor.

With respect to elastic deformation, stress and strain are proportional. Accordingly, the reason why the drain current increased when the tensile stress was applied to the channel of the n-channel field effect transistor in parallel, as shown by the results of the experiments, is that electrons had a higher mobility than prior to the application of stress loads because the crystal lattice of the silicon constituting the channel was distorted in a parallel pulling direction within the channel face.

That is, the inventors clarified that the drain current characteristics of the n- and p-channel field effect transistors depend on the direction and absolute value of distortion in the crystal lattice of the silicon constituting the channel. The distortion occurring in the silicon crystal can also be measured by a TEM, electron beam diffraction or Raman spectroscopy.

In laminated structures of multilayer films such as transistors, thermal stress results from differences in linear expansion coefficient between materials, and intrinsic stress results from differences in lattice coefficient or film contraction upon crystallization, leading to residual stress inside the structure. In general, field effect transistors, which are made finer year by year, have their generations expressed by their gate lengths.

The inventors analyzed the stress of field effect transistor structures to find that as the machined dimensions of the gate decreases, the stress occurring inside the structure increases owing to the reduced size of the structure and the use of new materials. In particular, a field effect transistor generation having a gate length of 0.1 μm undergo oxidization-induced stress associated with shallow trench isolation, reaction-induced stress in silicide, crystallization stress in polycrystal silicon, and the like.

FIG. 24 is a graph showing the results of analysis of the stress of a channel portion of various field effect transistor generations having corresponding gate lengths, using a finite element method. As shown in FIG. 24, a field effect transistor generation having a relatively large gate length of 2 μm undergoes low stress in the channel portion under the gate. However, field effect transistor generations having a gate length of 0.25 μm or less undergo significantly high stress, and the stress of a field effect transistor generation having a gate length of 0.1 μm is about three times as high as that of a field effect transistor generation having a gate length of 2 μm. The effects on transistor characteristics of stress occurring in field effect transistors have been studied. For example, the dependency of mutual conductance (Gm), one of the field effect transistor characteristics, on stress has been studied (Akemi Hamada et al., IEEE Trans. Electron Devices, vol. 38, No. 4, pp. 895–900, 1991).

However, much attention has not been paid to variations in field effect transistor characteristics depending on stress. This may be because generations prior to a gate length of 0.25 μm, that is, field effect transistors having a 0.25 μm or more undergo low stress in their structures.

Furthermore, these transistors may not be so sensitive to stress.

FIG. 25 is a graph showing a comparison between the results of experiments on the dependency of mutual conductance Gm on stress as set forth in the above document (Akemi Hamada, et al., IEEE Trans. Electron Devices, vol. 38, No. 4, pp. 895–900, 1991) and the results of experiments on the same dependency (gate length: 0.2 μm).

The comparison in FIG. 25 was carried out by applying a stress load parallel to a channel, to an n-channel field effect transistor. The dependency of Gm on stress of a transistor generation having a gate length of 0.2 μm was about fourfold greater than that of a transistor generation having a gate length of 2 μm. This indicates that the younger the transistor generation, the more sensitive to stress the transistor characteristic.

Further, as a result of stress analysis, the distribution of stress in the depth direction of an Si substrate of a field effect transistor in a channel portion of the substrate shows that a stress concentration field is formed in the vicinity of a gate electrode. In a transistor generation having a small gate length of 0.1 μm, a diffusion layer is formed in a shallow area close to a surface of the substrate, compared to conventional transistors having a larger gate length. As a result, in the transistor generation having a gate length of 0.1 μm, an element operating area is unlikely to be affected by stress.

Thus, the inventors applied stress analysis to field effect transistor structures using a finite element method to carry out sensitivity analysis for the effects of the materials constituting the field effect transistor and surrounding materials on the stress of the channel portion, through which drain current flows.

As a result, the inventors confirmed that a film wrapping a gate electrode from above, a silicide film, the gate electrode, and a side wall drastically affects the stress of the channel portion.

The present invention clarifies that for example, tensile stress can be induced in the channel portion by increasing the intrinsic stress of an SiN film covering the gate electrode, increasing the thickness of the SiN film or silicide film or the intrinsic stress of the gate electrode film, or reducing the oxidation-induced stress of STI (FIGS. 3 and 7).

In this connection, the stress of the SiN film has such relations with an etching rate for this film as shown in FIG. 8, described later, and that the film undergoes high stress when a large etching rate is used for this film.

In view of these points, the semiconductor device is preferably constructed as follows:

In a semiconductor device comprising an n-channel field effect transistor and a p-channel field effect transistor both formed on a substrate, residual stress acting along a direction in which drain current flows through a channel portion of the n-channel field effect transistor comprises more tensile stress than residual stress acting along a direction in which drain current flows through a channel portion of the p-channel field effect transistor.

Alternatively, in a semiconductor device comprising an n-channel field effect transistor and a p-channel field effect transistor both formed on a substrate, residual stress acting along a direction in which drain current flows through a channel portion of the n-channel field effect transistor is tensile stress, and residual stress along a direction in which drain current flows through a channel portion of the p-channel field effect transistor is compression stress.

This improves the drain current characteristics of both the n- and p-channel types, thereby providing a semiconductor device that generally exhibits high performance.

Further, the semiconductor device of the present invention is reliable enough to prevent defects and the like.

Alternatively, in a semiconductor device comprising an n-channel field effect transistor and a p-channel field effect transistor both formed on a substrate, the transistors each comprise an insulated film wrapping a gate electrode and extending to a location adjacent to a source/drain area, and the insulated film of the n-channel field effect transistor has higher tensile stress than that of the p-channel field effect transistor.

The location adjacent to the source/drain area means that, for example, the insulated area lies on a top of the source/drain area. If a silicide area is formed in the source/drain area, the insulated film can be formed to lie on the silicide area.

To have any of the above described forms, the following constructions are preferred:

(1) A semiconductor device comprising an n-channel field effect transistor and a p-channel field effect transistor both formed on a substrate, the transistors each comprise an insulated film wrapping a gate electrode and extending to a location adjacent to a source/drain area, the insulated film is mainly composed of silicon nitride, and the thickness of the insulated film of the n-channel field effect transistor differs from the thickness of the insulated film of the p-channel field effect transistor.

This generally improves the current characteristics of the semiconductor device comprising the n-channel field effect transistor and the p-channel field effect transistor. Furthermore, the above construction effectively produces this effect because the current characteristics are not affected by changes in or adjustments for the insulated film.

For example, the insulated film has higher tensile stress than the insulated film of the p-channel field effect transistor.

If, for example, the insulated films of the n- and p-channel field effect transistors have tensile stress remaining therein, then the insulated film of the n-channel field effect transistor is formed to be thicker than that of the p-channel field effect transistor. On the other hand, if, for example, the insulated films of the n- and p-channel field effect transistors have compression stress remaining therein, then the insulated film of the n-channel field effect transistor is formed to be thinner than that of the p-channel field effect transistor. The thickness of the insulated film may be compared on the basis of, for example, the average thickness of the semiconductor device.

Alternatively, the insulated films are each mainly composed of silicon nitride, and the insulated film of the p-channel field effect transistor contains more of at least one of silicon (Si), nitrogen (N), oxygen (O), argon (Ar), helium (He), and germanium (Ge) than the insulated film of the n-channel field effect transistor.

(2) Further, preferably, in (1), the insulated film is mainly composed of silicon nitride, and the size of an area extending adjacent to a source/drain area of the insulated film is different between the insulated film of the n-channel field effect transistor and the insulated film of the p-channel field effect transistor.

Instead of the above area, the length of a portion of the insulated film which lies on the source/drain area may be compared.

Specifically, if, for example, the insulated films of the n- and p-channel field effect transistors have tensile stress remaining therein, then the insulated film of the n-channel field effect transistor is formed to be larger in area than that of the p-channel field effect transistor.

On the other hand, if, for example, the insulated films of the n- and p-channel field effect transistors have compression stress remaining therein, then the insulated film of the n-channel field effect transistor is formed to be smaller in area than that of the p-channel field effect transistor. The above area may be compared on the basis of, for example, the average area of the insulated film in the semiconductor device.

Instead of the above area, the length of a portion of the insulated film which crosses the source/drain area from source to drain may be compared. Specifically, if, for example, the insulated films of the n- and p-channel field effect transistors have tensile stress remaining therein, then the insulated film of the n-channel field effect transistor is formed to be longer than that of the p-channel field effect transistor.

On the other hand, if, for example, the insulated films of the n- and p-channel field effect transistors have compression stress remaining therein, then the insulated film of the n-channel field effect transistor is formed to be shorter than that of the p-channel field effect transistor.

This generally improves the current characteristics of the semiconductor device comprising the n-channel field effect transistor and the p-channel field effect transistor. Furthermore, the above construction effectively produces this effect because the current characteristics are not affected by changes in or adjustments for the insulated film.

(3) In a semiconductor device comprising an n-channel field effect transistor and a p-channel field effect transistor both formed on a substrate, the transistors each have a silicide area formed in a source or drain area, and the silicide area of the n-channel field effect transistor is thicker than that of the p-channel field effect transistor.

The above thickness may be compared on the basis of the average thickness of the silicide area in the semiconductor device.

This generally improves the effects of the semiconductor device, and the above construction effectively produces this effect because the current characteristics are not affected by changes in or adjustments for the insulated film.

(4) Preferably, in (3), the silicide area is mainly composed of cobalt silicide ($COSi_2$), titanium silicide ($TiSi_2$), or nickel silicide.

(5) According to an alternative form, in a semiconductor device comprising an n-channel field effect transistor and a p-channel field effect transistor both formed on a substrate, a gate electrode of the n-channel field effect transistor is formed to undergo higher compression film stress than that of the p-channel field effect transistor.

(6) In a semiconductor device comprising an n-channel field effect transistor and a p-channel field effect transistor both formed on a substrate, impurities contained in the gate electrode of the n-channel field effect transistor have a concentration gradient in a perpendicular direction in a main plane of the silicon substrate, and impurities contained in the gate electrode of the p-channel field effect transistor have no concentration gradient in the perpendicular direction in the main plane of the silicon substrate within measurement limits or have a smaller concentration gradient than those in the gate electrode of the n-channel field effect transistor.

For example, impurities in the gate electrode of the n-channel field effect transistor have a concentration gradient in the perpendicular direction in the main plane of the silicon substrate. The distribution of the impurity concentration of the gate electrode of the p-channel field effect transistor is even in the perpendicular direction in the main plane of the silicon substrate.

(7) In a semiconductor device comprising an n-channel field effect transistor and a p-channel field effect transistor both formed on a substrate, the gate electrode of the n-channel field effect transistor has a smaller average crystal grain size than that of the p-channel field effect transistor.

This generally improves the current characteristics of the semiconductor device comprising the n-channel field effect transistor and the p-channel field effect transistor. Furthermore, the above construction allows the gate electrode located immediately above the channel portion to be controlled by adjusting the crystal grain size, thereby enabling the channel portion to be effectively subjected to stress.

(8) In a semiconductor device comprising an n-channel field effect transistor, a p-channel field effect transistor, and element separating means for electrically separating adjacent transistor elements from each other, the n- and p-channel field effect transistor and the element separating means all being formed on a substrate, the distance between a channel portion of the n-channel field effect transistor and the element separating means is larger than that between a channel portion of the p-channel field effect transistor and the element separating means.

This generally improves the current characteristics of the semiconductor device comprising the n-channel field effect transistor and the p-channel field effect transistor. Furthermore, the above construction effectively produces this effect because it requires only the adjustments for a mask pattern.

(9) In a semiconductor device comprising an n-channel field effect transistor and a p-channel field effect transistor both formed on a substrate, a Raman shift in a Raman spectrum obtained when a channel portion of the n-channel field effect transistor is irradiated with laser beams is smaller than that obtained when a channel portion of the p-channel field effect transistor is irradiated with laser beams.

For example, the crystal lattice interstice determined when the channel portion of the n-channel field effect transistor is observed using a TEM is larger than that determined when the channel portion of the p-channel field effect transistor is observed using a TEM.

The above samples are preferably formed along a direction that crosses the source/drain area.

(10) Preferably, in (1), the insulated film is mainly composed of silicon nitride, and an etching rate for the insulated film of the n-channel field effect transistor is different from that for the insulated film of the insulated film of the p-channel field effect transistor.

For example, the insulated film of the n-channel field effect transistor has a smaller etching rate than that of the p-channel field effect transistor.

(11) A process of manufacturing a semiconductor device comprising an n-channel field effect transistor and a p-channel field effect transistor both formed on a substrate, the process comprising the steps of forming an element separating structure on the substrate, forming a gate electrode of the n-channel field effect transistor and a gate electrode of the p-channel field effect transistor in an area separated by the element separating structure, forming an insulated layer on the gate electrodes, the insulated layer covering the gate electrodes, and allowing a channel portion of the p-channel field effect transistor to leave tensile stress in a channel portion of the n-channel field effect transistor in a direction that bridges across a source and a drain.

In an alternative form, a process of manufacturing a semiconductor device comprising an n-channel field effect transistor and a p-channel field effect transistor both formed on a substrate, the process comprising the steps of forming an element separating structure on the substrate, forming a gate electrode of the n-channel field effect transistor and a gate electrode of the p-channel field effect transistor in an area separated by the element separating structure, forming an insulated layer on the gate electrodes, the insulated layer covering the gate electrodes, and injecting more of at least one of silicon, nitrogen, oxygen, argon, helium, and germanium in the insulated film of the p-channel field effect transistor than in the insulated film of the n-channel field effect transistor.

Further, one of the insulated films may be thinned or thickened by etching. Furthermore, after the gate electrodes have been formed, impurities may be introduced into the gate electrode of the n-channel field effect transistor. The process may further comprise the step of setting an electrode of the n-channel field effect transistor to have a smaller particle size than that of the p-channel field effect transistor.

For example, specifically, if an insulated film undergoing tensile stress is formed on the n-channel field effect transistor and the p-channel field effect transistor, a portion of the insulated film which is thinner than a portion of the insulated film which is formed on the first or second p-channel field effect transistor is formed in an area located between a first p-channel field effect transistor and a second p-channel field effect transistor adjacent to the first p-channel field effect transistor, or the insulated film is etched between the first p-channel field effect transistor and the second p-channel field effect transistor so as not to be installed therebetween.

If an insulated film undergoing compression stress is formed on the n-channel field effect transistor and the p-channel field effect transistor, a portion of the insulated film which is thinner than a portion of the insulated film which is formed in the area located between the first p-channel field effect transistor and the second p-channel field effect transistor adjacent to the first p-channel field effect transistor is formed in an area located between a first n-channel field effect transistor corresponding to the first p-channel field effect transistor and a second n-channel field effect transistor corresponding to the second p-channel field effect transistor, or the insulated film is etched in the area located between the first n-channel field effect transistor and the second n-channel field effect transistor so as not to be installed therein.

Alternatively, in a semiconductor device comprising an n-channel field effect transistor and a p-channel field effect transistor both formed on a substrate, an insulated film adjacent to a longitudinal side of a gate electrode of the n-channel field effect transistor has film quality different from that of an insulated film adjacent to a longitudinal side of a gate electrode of the p-channel field effect transistor.

Alternatively, in a semiconductor device comprising an n-channel field effect transistor and a p-channel field effect transistor both formed on a substrate, film stress of an insulated film adjacent to a longitudinal side of a gate electrode of the n-channel field effect transistor is composed of more tensile stress than that of an insulated film adjacent to a longitudinal side of a gate electrode of the p-channel field effect transistor.

Preferably, in the above case, the insulated films are each mainly composed of silicon nitride.

(12) In a semiconductor device comprising an n-channel field effect transistor and a p-channel field effect transistor both formed on a substrate, if tensile stress acts on an insulated film wrapping a gate electrode of each of the transistors and extending to an area adjacent to a source/drain area, then in a portion of the insulated film which is adjacent to the longitudinal side of the gate electrode, the p-channel field effect transistor has a smaller Young's modulus than the n-channel field effect transistor, and if compression stress acts on the insulated film wrapping the gate electrode of each of the transistors and extending to the area adjacent to the source/drain area, then in a portion of the insulated film which is adjacent to the longitudinal side of the gate electrode, the p-channel field effect transistor has a larger Young's modulus than the n-channel field effect transistor.

This generally improves the current characteristics of the semiconductor device comprising the n-channel field effect transistor and the p-channel field effect transistor. Furthermore, the above construction also effectively produces this effect because it does not affect the current characteristics.

(13) Preferably, in (12), a material of the insulated film located adjacent to the longitudinal side of the gate electrode and having a large Young's modulus is mainly composed of silicon nitride, and a material of the insulated film located adjacent to the longitudinal side of the gate electrode and having a small Young's modulus is mainly composed of silicon oxide.

(14) In a semiconductor device comprising an n-channel field effect transistor and a p-channel field effect transistor both formed on a substrate, the n-channel field effect transistor includes a plurality of n-channel field effect transistors and the p-channel field effect transistor includes a plurality of p-channel field effect transistors, an insulated film is formed on the n-channel field effect transistors and the p-channel field effect transistors, and a portion of the insulated film which is thinner than a portion of the insulated film which is formed on a first p-channel field effect transistor or a second p-channel field effect transistor adjacent to the first p-channel field effect transistor is formed between the first p-channel field effect transistor and the second p-channel field effect transistor, or the insulated film is not installed the first p-channel field effect transistor and the second p-channel field effect transistor.

The semiconductor device preferably has an n-channel field effect transistor area and a p-channel field effect transistor formed therein, the n-channel field effect transistor area having the n-channel field effect transistors arranged adjacent to each other, the p-channel field effect transistor area having the p-channel field effect transistors arranged adjacent to each other.

In other words, a portion of a first insulated film (for example, stress control film) with tensile stress is formed on the gate electrode of the n-channel field effect transistors and the p-channel field effect transistors, and a portion of the first insulated film which is thinner than the above portion of the first insulated film is formed between a first p-channel field effect transistor and a second p-channel field effect transistor adjacent to the first p-channel field effect transistor, or the first insulated film is not installed between the first p-channel field effect transistor and the second p-channel field effect transistor. Then, a second insulated film (for example, an interlayer insulated film) having components different from those of the first insulated film is formed on the second insulated film.

Alternatively, the semiconductor device may comprise a field area having an insulated layer embedded in a main surface thereof, a first to fourth active areas each surrounded by the field area, a first and second p-channel field effect transistors formed in the first and second active areas, respectively, a third and fourth n-channel field effect transistors formed in the third and fourth active areas, respectively, and an insulated film undergoing tensile stress and which wraps a gate electrode and extends to a location adjacent to the source/drain area in each of the first to fourth transistors. The first and second active areas are arranged adjacent to each other via the field area so that drain current flows in the same direction in both the first and second transistors, the third and fourth active areas are arranged adjacent to each other via the field area so that drain current flows in the same direction in both the first and second transistors, and the insulated film wraps the first to fourth transistors and has a slit formed in a portion of the field area which is sandwiched between the first and second active areas.

(15) In a semiconductor device comprising an n-channel field effect transistor and a p-channel field effect transistor both formed on a substrate, the n-channel field effect transistor includes a plurality of n-channel field effect transistors and the p-channel field effect transistor includes a plurality of p-channel field effect transistors, an insulated film undergoing tensile stress is formed on the n-channel field effect transistors and the p-channel field effect transistors, and a portion of the insulated film which is thinner than a portion of the insulated film which is formed in an area located between a first n-channel field effect transistor and a second n-channel field effect transistor is formed in an area located between a first p-channel field effect transistor and a second p-channel field effect transistor adjacent to the first p-channel field effect transistor, the first n-channel field effect transistor corresponding to the first p-channel field effect transistor, the second n-channel field effect transistor corresponding to the second p-channel field effect transistor, or the insulated film is not formed in the area located between the first p-channel field effect transistor and the second p-channel field effect transistor.

The insulated film corresponds to, for example, a stress control film. Further, an interlayer insulated film can be formed on the stress control film.

Alternatively, in a semiconductor device comprising an n-channel field effect transistor and a p-channel field effect transistor both formed on a substrate, the n-channel field effect transistor includes a plurality of n-channel field effect transistors and the p-channel field effect transistor includes a plurality of p-channel field effect transistors, an insulated film undergoing tensile stress is formed on the n-channel field effect transistors and the p-channel field effect transistors, and a portion of the insulated film which is thinner than a portion of the insulated film which is formed in an area located between a first p-channel field effect transistor and a first n-channel field effect transistor is formed in an area located between a first p-channel field effect transistor and a second p-channel field effect transistor adjacent to the first p-channel field effect transistor, the first n-channel field effect transistor corresponding to the first p-channel field effect transistor, or the insulated film is not formed in the area located between the first p-channel field effect transistor and the first n-channel field effect transistor.

In either of the above forms, the stress control film can be formed between the active area in which the first p-channel field effect transistor is arranged and the active area in which the first n-channel field effect transistor corresponding to the first p-channel field effect transistor is arranged. Further, the stress control film can be formed on the n-channel field effect transistor.

Alternatively, a portion of the insulated film (for example, the stress control film) which is thinner than a portion of the insulated film which is arranged on the first n-channel field effect transistor is formed in an area located between the first p-channel field effect transistor and the second p-channel field effect transistor.

Alternatively, a portion of the insulated film (for example, the stress control film) which is thinner than a portion of the insulated film which is formed on the first n-channel field effect transistor is formed in an area that crosses (for example, is orthogonal to) a longitudinal direction of a gate electrode of the first p-channel field effect transistor, or the insulated film is not installed in this area. Alternatively, a portion of the insulated film which is thinner than a portion of the insulated film which is formed in a portion of the field area which crosses (for example, is orthogonal to) a longitudinal direction of a gate electrode of the first n-channel field effect transistor and which is adjacent to the active area with the first n-channel field effect transistor formed therein is formed in a portion of the field area which crosses (for example, is orthogonal to) the longitudinal direction of the gate electrode of the first p-channel field effect transistor and which is adjacent to the active area with the first p-channel field effect transistor formed therein, or the insulated film is not installed in the latter portion of the field area.

In an alternative form, a potion of the insulated film (for example, the stress control film) which is thinner than a portion of the insulated film which is formed on the first p-channel field effect transistor can be formed in an area that crosses (for example, is orthogonal to) a longitudinal direction of the gate electrode of the first p-channel field effect transistor, or the insulated film is not installed in this area.

(16) In a semiconductor device comprising an n-channel field effect transistor and a p-channel field effect transistor both formed on a substrate, the n-channel field effect transistor includes a plurality of n-channel field effect transistors and the p-channel field effect transistor includes a plurality of p-channel field effect transistors, an insulated film undergoing compression stress is formed on the n-channel field effect transistors and the p-channel field effect transistors, and a portion of the insulated film which is thinner than a portion of the insulated film which is formed in an area located between a first p-channel field effect transistor and a second p-channel field effect transistor adjacent to the first p-channel field effect transistor is formed in an area located between a first n-channel field effect transistor corresponding to the first p-channel field effect transistor and a second n-channel field effect transistor corresponding to the second p-channel field effect transistor, or the insulated film is not formed in the area located between the first n-channel field effect transistor and the second n-channel field effect transistor.

Alternatively, a portion of the insulated film which is thinner than a portion of the insulated film which is formed in an area located between the first p-channel field effect transistor and the second p-channel field effect transistor adjacent to the first p-channel field effect transistor can be formed in an area located between the first p-channel field effect transistor and the first n-channel field effect transistor corresponding to the first p-channel field effect transistor, or the insulated film is not formed in the area located between the first p-channel field effect transistor and the first n-channel field effect transistor.

Alternatively, the semiconductor device may comprise a field area having an insulated layer embedded in a main surface thereof, a first to third active areas each surrounded by the field area, a first and second p-channel field effect transistors formed in the first and second active areas, respectively, a third n-channel field effect transistor formed in the third active area, and an insulated film undergoing compression stress and which wraps a gate electrode and extends to a location adjacent to the source/drain area in each of the first to third transistors. The first and second active areas are arranged adjacent to each other via the field area so that drain current flows in the same direction in both the first and second transistors, and the insulated film wraps the first to third transistors and has slits formed on portions of the field area which are adjacent to the first and second active areas and in a direction perpendicular to a direction in which drain current mainly flows through the first and second transistors and formed around a portion of the field area which is adjacent to the third active area.

Alternatively, a portion of the insulated film (for example, the compression control film) which is thinner than a portion of the insulated film which is arranged on the first p-channel field effect transistor is formed in an area located between the first n-channel field effect transistor and the second n-channel field effect transistor.

Alternatively, a portion of the insulated film (for example, the compression control film) which is thinner than a portion of the insulated film which is formed on the first n-channel field effect transistor is formed in an area located longitudinally of a gate electrode of the first p-channel field effect transistor, or the insulated film is not installed in this area. Alternatively, a portion of the insulated film which is thinner than a portion of the insulated film which is formed in a portion of the field area which crosses (for example, is orthogonal to) the longitudinal direction of the gate electrode of the first p-channel field effect transistor and which is adjacent to the active area with the first p-channel field effect transistor formed therein is formed in a portion of the field area which crosses (for example, is orthogonal to) a longitudinal direction of a gate electrode of the first n-channel field effect transistor and which is adjacent to the active area with the first n-channel field effect transistor formed therein, or the insulated film is not installed in the latter portion of the field area.

(17) The above described semiconductor device is characterized in that the insulated film is mainly composed of silicon nitride.

When the inventors investigated known examples, the following related techniques for applying stress to the channel portion were extracted. However, none of these techniques provide the constructions, operations, or effects of the present invention.

For example, JP-A-60-52052 specification discloses that layers underlying a channel portion include a spinel layer under a p channel portion and an $SiO_2$ layer under an n channel portion. JP-A-7-32122, 10-92947, 2000-243854, and 2000-160594 specifications disclose that the layers underlying the channel portion include an SiGe layer comprising an Si layer arranged on a p channel as an underlying layer and an Si layer comprising an SiGe layer on an n channel as an underlying layer. However, since these layers are inserted into the underlying area (area of the channel portion below the area thereof in which current flows (for example, an area located about 5 nm or more away from the interface between the channel portion and a gate insulated film in a direction opposite the gate insulated film), if a defect occurs in an end of these layers, the electric characteristics may be affected. Further, JP-A-2000-36567, 2000-36605, and 2001-24468 specifications disclose that an element separating section adjacent to a transistor in a PMOS portion is pressurized by controlling the amount of oxidation in the LOCOS. However, the LOCOS makes it difficult to effectively integrate a larger number of transistors on a substrate, and this arrangement may drastically increase the number of required steps.

BEST MODE FOR CARRYING OUT THE INVENTION

A first embodiment of the present invention will be described below by referring to FIGS. 1 to 3, 8, and 31.

Figure 1:
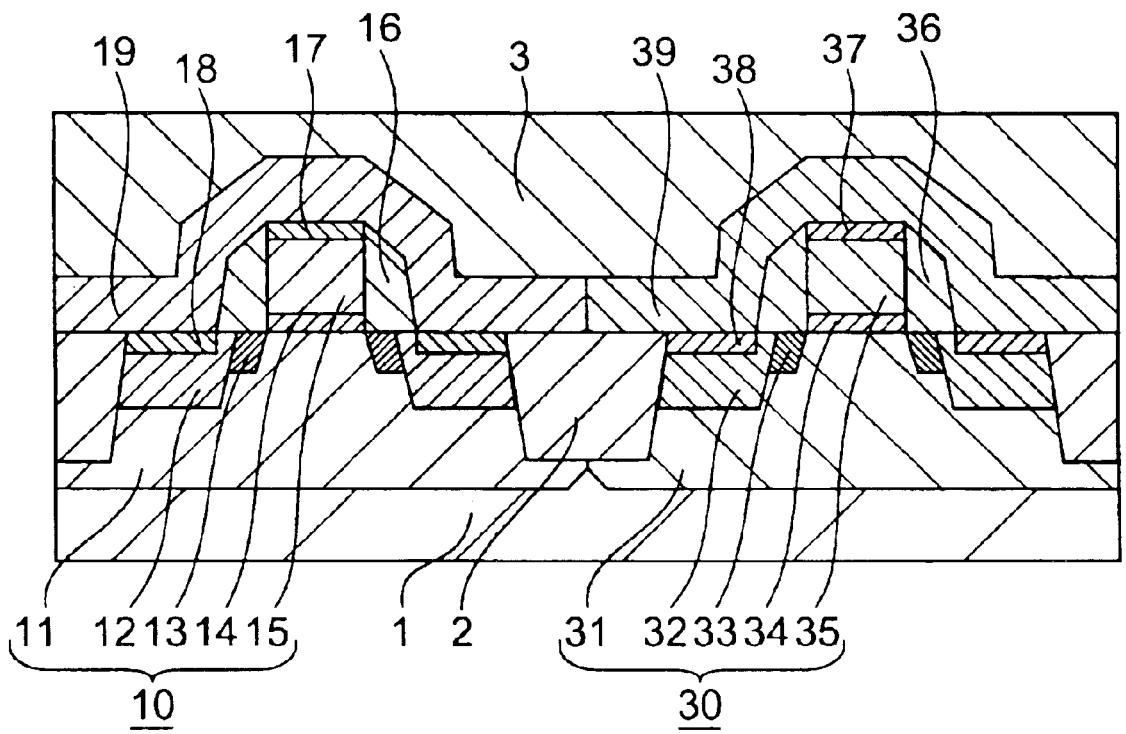
FIG. 1 is a schematic sectional view showing a semiconductor device as a first embodiment of the present invention.
Figure 2:
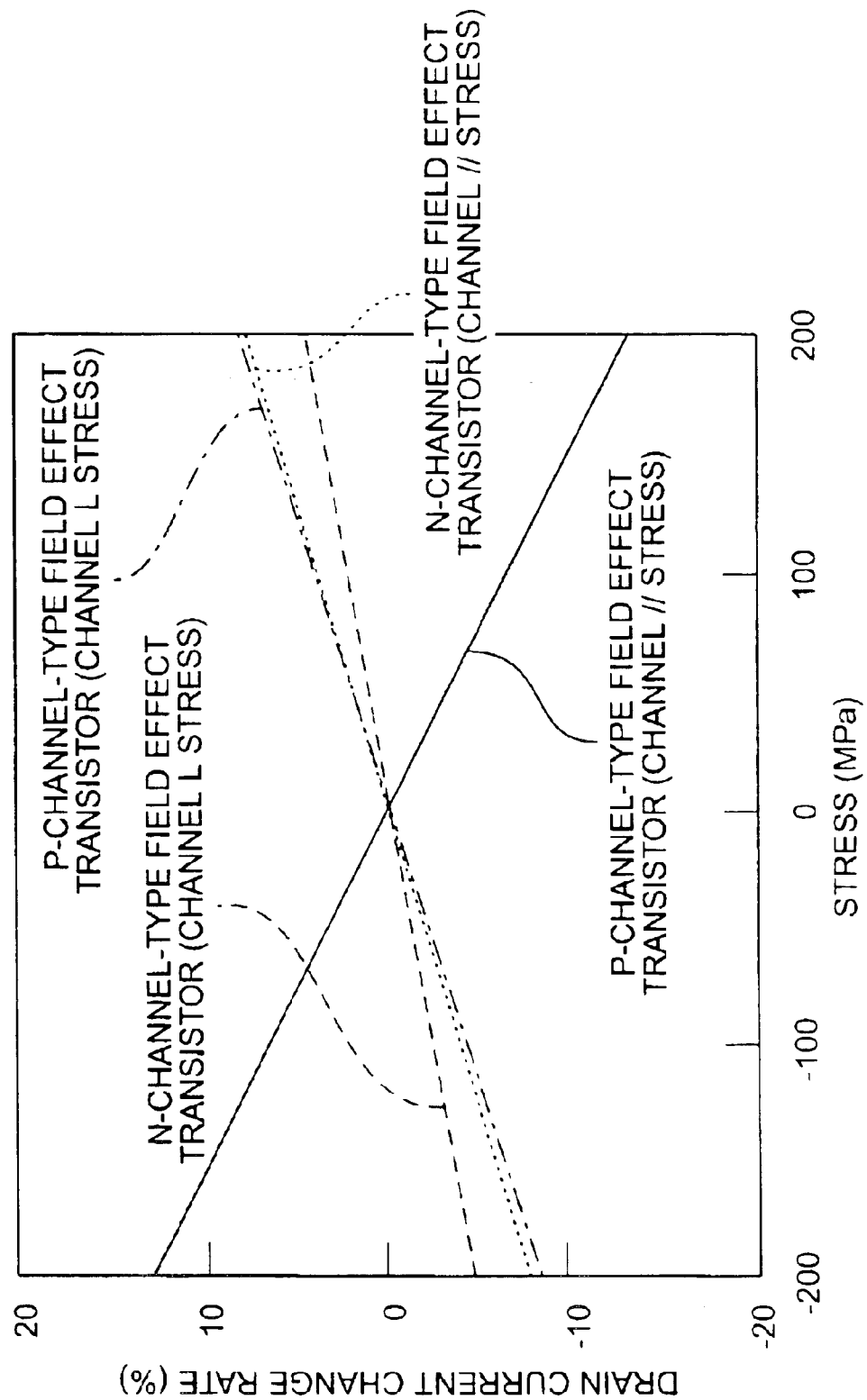
FIG. 2 is a graph showing the results of experiments on the dependency on stress of drain current in an n-channel field effect transistor and a p-channel field effect transistor.
Figure 3:
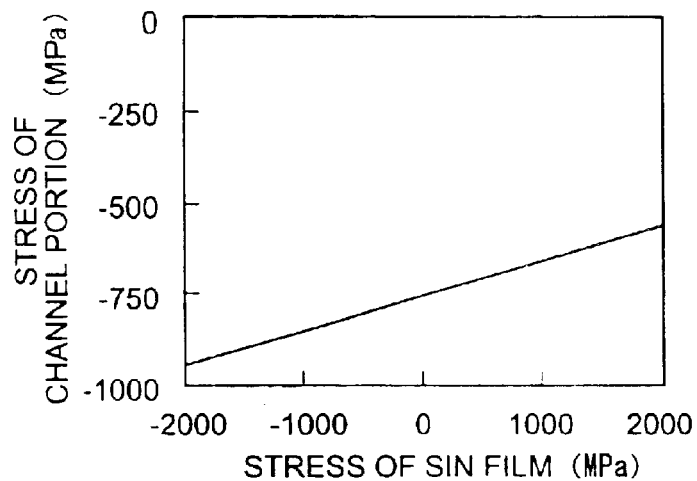
FIG. 3 is graph showing the results of analysis of the effects of the thickness of an SiN film wrapping a gate electrode from above, on the stress of a channel portion.
Figure 8:
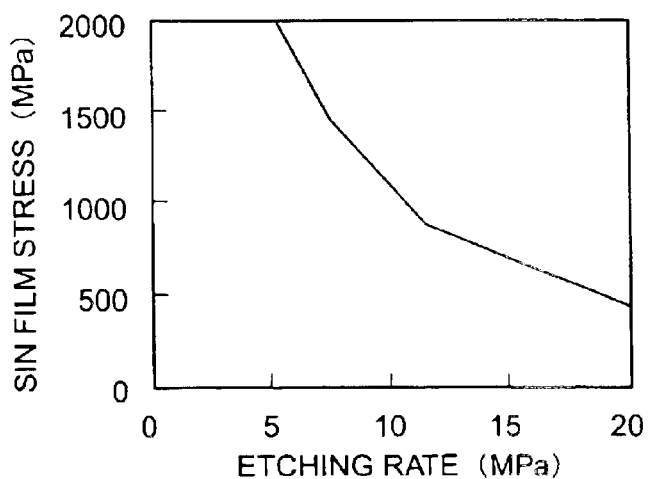
FIG. 8 is a graph showing the results of experiments on the dependency of the stress of the SiN film on an etching rate.
Figure 31:
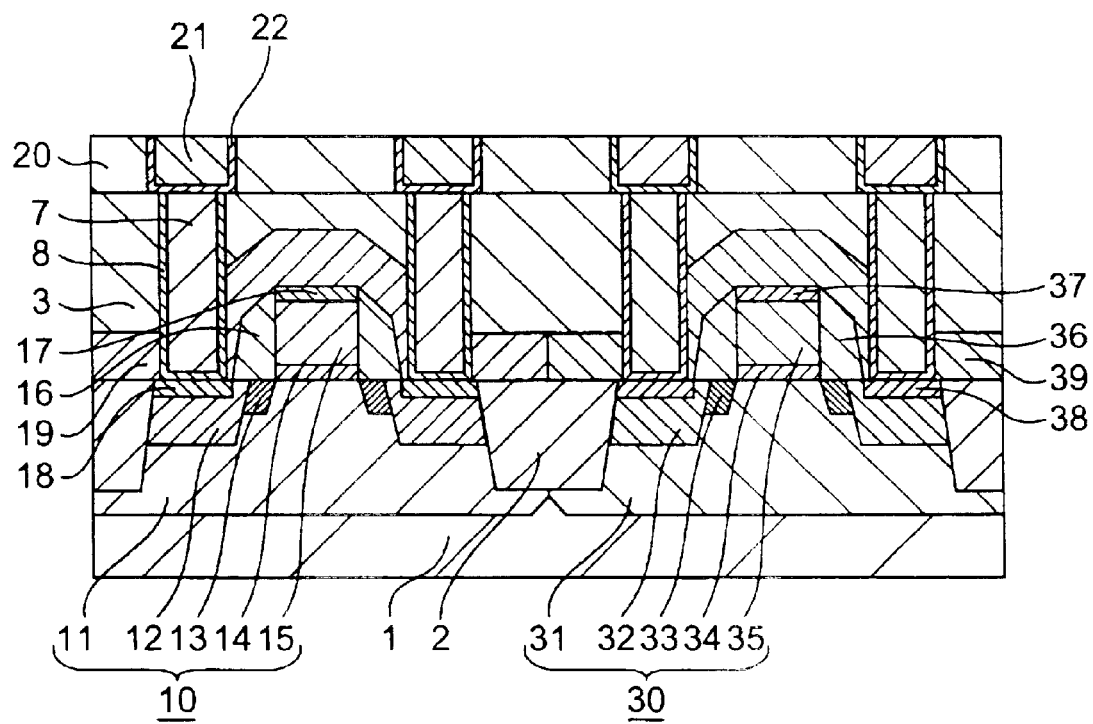
FIG. 31 is a schematic sectional view showing an example in which contact plugs, wires, and others are formed in the semiconductor device as the first embodiment of the present invention.

FIG. 1 is a typical sectional view of a semiconductor device according to the first embodiment of the present invention. FIG. 2 shows a stress dependence of a drain current of n- and p-channel-type field effect transistors. FIG. 3 shows a result of analyzing a stress of an effect of an intrinsic stress of an SiN film covering a gate electrode from an upper surface on a channel partial stress (the channel face stress parallel to the drain current). FIG. 8 shows an etching rate dependence of the SiN film stress. FIG. 31 shows an example of providing a wiring, etc. for the semiconductor device shown in FIG. 1.

The semiconductor device according to the first embodiment of the present invention comprises, as shown in FIG. 1, an n-channel-type field effect transistor 10 formed on a main surface of a silicon substrate 1, a p-channel-type field effect transistor 30, stress control insulated films 19 and 39 formed on the upper surfaces of the transistors 10 and 30 respectively.

The n-channel-type field effect transistor comprises an n-type source/drain (12, 13), a gate insulated film 14, and a gate electrode 15 formed on a p-type well, wherein silicides 17 and 18 are formed on the upper surfaces of the gate electrode 15 and the source/drain (12, 13). An n-type source/drain refers to a source area and a drain area indicated by 12 and 13 on either side of the gate insulated film 14. The difference between a source and a drain is that an electric current flows from one to the other, and there is no difference in a basic structure. In this specification, they are referred to as a source/drain (12, 13). Similarly described are the p-channel-type field effect transistor and the subsequent components.

The p-channel-type field effect transistor comprises p-type source/drain (32, 33), a gate insulated film 34, and a gate electrode 35 formed on a n-type well, wherein silicide 37 and 38 are formed on the upper surfaces of the gate electrode 35 and the source/drain (32, 33). These transistors are insulated from other transistors by shallow groove device separation 2 formed by a silicon oxide film ($SiO_2$), and silicon nitride (SiN).

The gate insulated films 14 and 34 comprise, for example, a dielectric film such as a silicon oxide film ($SiO_2$), a silicon nitride film (SiN), titanium oxide ($TiO_2$), zirconium oxide ($ZrO_2$), hafnium oxide ($HfO_2$), tantalum pentoxide ($Ta_2O_5$), etc., or a laminated structure formed by them. The gate electrodes 15 and 35 comprise, for example, a polycrystalline silicon film, or a metal film such as tungsten (W), platinum (Pt), ruthenium (Ru), etc., or a laminated structure formed by them.

Side walls 16 and 36 comprising silicon nitride (SiN) and a silicon oxide film ($SiO_2$) are formed on the side walls of the gate insulated films 14 and 34, the gate electrodes 15 and 35, and the silicide 17, 18, 37, and 38.

The stress control films 19 and 39 are formed on the upper surface of the n- and p-channel-type field effect transistor respectively. Furthermore, for example, the upper surfaces of the stress control films 19 and 39 are covered with, for example, an interlayer dielectric 3 such as a BPSG (Boron-doped Phospho Silicate Glass) film, an SOG (Spin On Glass) film, a TEOS (Tetra-Ethyl-Ortho-Silicate) film, a silicon oxide film formed in a chemical vapor growing method or a spattering method, etc.

The n-channel-type field effect transistor and the p-channel-type field effect transistor formed on the silicon substrate 1 are electrically connected through a contact plug, wiring, etc. as shown in FIG. 31 such that a desired circuit can be configured. The first embodiment of the present invention uses the stress control films 19 and 39 as means for controlling the stress of the channel portion of the n- and p-channel-type field effect transistors. Other portions can be any structures or materials according to any embodiments other than the first embodiment of the present invention.

Furthermore, in the example shown in FIG. 1, a contact plug, wiring, etc. are omitted. In other embodiments except the example shown in FIG. 31, a contact plug, wiring, etc. are omitted likewise.

The stress control film 19 and the stress control film 39 are mainly made of silicon nitride (SiN), and can be formed in the chemical vapor growing method or the spatter method. The film stress of the stress control film 19 is the tensile stress rather than the film stress of the stress control film 39.

In the development of the semiconductor device such as an LSI, etc., the drain current of a field effect transistor is improved (an increasing amount of drain currents) year by year. The inventors of the present invention have disclosed that a drain current changes with the stress, and have found the method for effectively improving the drain currents of the n- and p-channel-type field effect transistors in the complementary field effect transistor having the p- and n-channel-type field effect transistors.

FIG. 2 is a graph showing the stress dependence of the drain current of a field effect transistor. In FIG. 2, in the n-channel-type field effect transistor, the drain current increases with tensile stress. On the other hand, in the p-channel-type field effect transistor, the drain current increases with compression stress.

On the other hand, FIG. 3 is a graph showing a result of analyzing the stress of the effect of the film stress of the silicon nitride (SiN) covering the upper surface of the gate electrode on the stress (on the channel plate parallel to the drain current) of the portion (channel) through which the drain current flows by means of a finite element method. As shown in FIG. 3, it is apparent that, when the film stress of the film covering the gate electrode becomes stronger on the tensile side, the stress of the channel portion becomes stronger also on the tensile side.

It is considered that the phenomenon occurs so that the tensile stress (film contraction) of the film of the portion can be generated to shift the stress of the channel portion to the tensile side with the film containing the gate electrode extended to the upper surface of the source/drain area.

Therefore, in the semiconductor device having the n- and p-channel-type field effect transistors, a film having the film stress on the tensile stress side is used as a film covering the gate electrode of the n-channel-type field effect transistor, and a film having the film stress much more on the compression stress than the n-channel type film is used as a film covering the gate electrode of the p-channel-type field effect transistor, thereby probably improving the drain currents of the n-channel type and the p-channel type. Therefore, the entire performance can be improved.

The inventors of the present application have also clarified that the etching rate of the silicon nitride (SiN) film depends on the stress.

FIG. 8 shows an example of a result of the experiment on the stress dependence of the etching rate of the silicon nitride (SiN) film. Based on the result shown in FIG. 8, it is clarified that the etching rate depends on the film stress.

The semiconductor device according to the first embodiment of the present invention includes at least a part of the gate electrode 15 on the upper surface of the n-channel-type field effect transistor 10, forms the stress control film 19 touching the source/drain 12 or 13 on which the silicide 18 is formed, includes at least a part of the gate electrode 35 of the p-channel-type field effect transistor 30, and forms the stress control film 39 touching the source/drain 32 or 33 on which the silicide 38 is formed, in which the tensile stress of the stress control film 19 is the stress on the tensile side as compared with the film stress of the stress control film 39, and it is desired that the stress control film 19 has tensile stress while the stress control film 39 has compression stress.

As a result, the channel face stress parallel to the drain current of the channel portion is strong tensile stress in the n-channel type while the compression stress is obtained in the p-channel type as compared with the stress of the n-channel type. Therefore, the drain currents can be improved for the n- and p-channel types.

Furthermore, since the stress control film 19 and the stress control film 39 are made of silicon nitride (SiN), they can be used as etching stoppers when a contact hole is made in the interlayer dielectric 3 made of silicon oxide film for electrical connection from an upper layer wiring to a source/drain area after forming the interlayer dielectric 3.

After forming a contact hole, a contact plug 7, wiring 21, etc. are, for example, shown in FIG. 31. There are a plurality of wiring layers. The contact plug 7 and the wiring 21 are made of, for example, tungsten, aluminum, copper, titanium, titanium nitride, etc. or a laminated structure of them. In addition, as shown in FIG. 31 the contact plug 7 and the wiring 21 can be configured with barrier metal 8 and 22 formed of laminated films such as titanium nitride, titanium.

Additionally, since the stress control film 19 and stress control film 39 can also be obtained by changing the film-forming conditions using the same film-forming equipment, they can be obtained without new equipment.

In the semiconductor device according to the first embodiment of the present invention, the channel face stress parallel to the drain current of the channel portion of the n-channel-type field effect transistor if on the tensile stress side as compared with the stress of the channel portion of the p-channel-type field effect transistor, and it is more desired that the stress of the channel portion of the n-channel type is tensile stress, and the stress of the channel portion of the p-channel type is compression stress. Therefore, it is not necessary that the films for the stress control films 19 and 39 are to be SiN so far as the film stress of the stress control film 19 is the stress on the tensile side as compared with the film stress of the stress control film 39, and it is more preferable that the film stress of the stress control film 19 is tensile stress and the film stress of the stress control film 39 is compression stress.

Under the above mentioned conditions, the detailed configuration of the above mentioned status is described below by referring to FIGS. 9 and 4.

Figure 9:
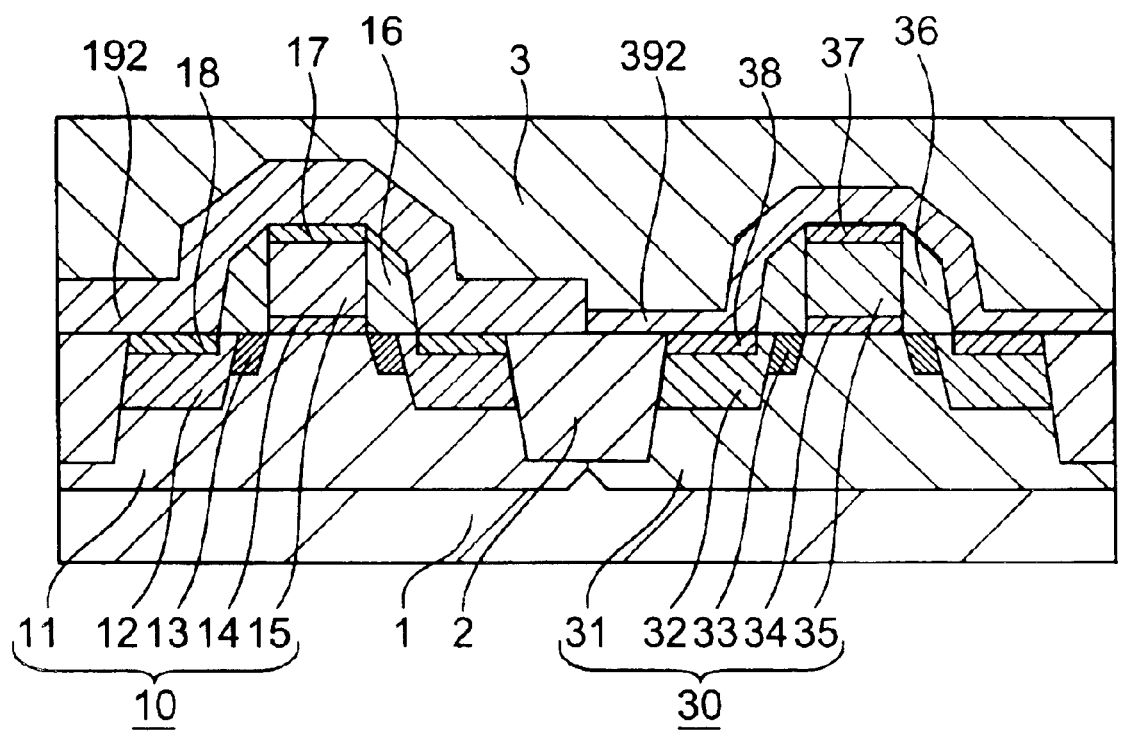
FIG. 9 is a schematic sectional view of a semiconductor device as the first embodiment of the present invention.

FIG. 9 is a typical view of the sectional structure of the semiconductor device according to the first embodiment of the present invention. FIG. 4 is a graph showing the analysis result of the film thickness dependence of the SiN film covering the gate electrode relating to the stress of the channel portion of the field effect transistor.

In the first embodiment of the above mentioned status of the first embodiment, the above described state is formed by constituting the state where the thicknesses of the films of the stress control films 192 and 392 are made to be different between the n-channel-type field effect transistor and the p-channel-type field effect transistor. That is, when the stress control film indicates the tensile stress, the stress control film 392 of the p-channel type is thinner than the stress control film 192 of the n-channel type as shown in FIG. 9.

On the other hand, when the stress control film indicates compression stress, it is desired that the stress control film 192 of the n-channel type is thinner than the stress control film 392 (not shown in the attached drawings). The stress control films 192 and the 392 are obtained by first forming a silicon nitride (SiN) film on the upper whole surfaces of the n- and p-channel-type field effect transistors in the chemical vapor growing method, the spatter method, etc., and then etching back the film up to a desired film thickness.

According to the first embodiment of the present invention, the stress control films 192 and 392 are used as means for controlling the stress of the channel portions of the n- and p-channel-type field effect transistors. Other portions can be of any structure or material of any other embodiments than the third embodiment (however, the film thickness depends on the data shown in FIG. 4).

Described below will be the effect of the operation of the semiconductor device according to the third embodiment.

Figure 4:
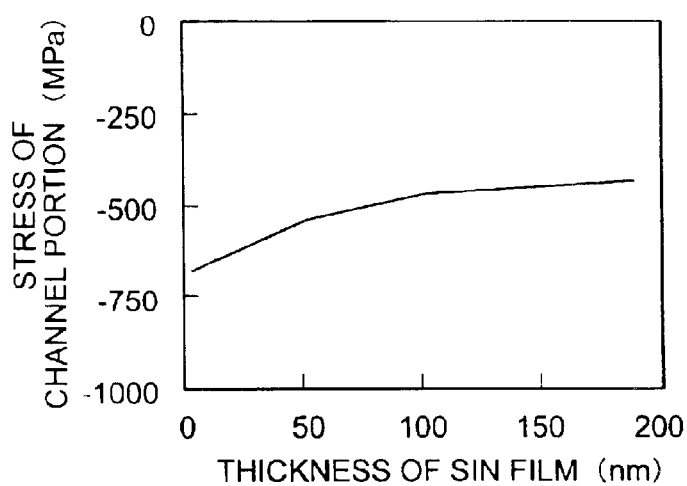
FIG. 4 is a graph showing the results of analysis of the effects of the thickness of the SiN film wrapping the gate electrode from above, on the stress of the channel portion.

FIG. 4 is a graph of the analysis result of the film thickness dependence of the stress control film covering the gate electrode. In FIG. 4, if the stress control film indicates tensile stress, and the film thickness is large, then the stress of the channel portion is shifted to the tensile stress side. On the other hand, if the stress control film indicates compression stress, and the film thickness is large, the stress of the channel is shifted to the compression stress side.

According to the first embodiment of the present invention, if the stress control film indicates tensile stress, the p-channel type is thinner, and the drain current of the p-channel-type field effect transistor can be improved as shown in FIG. 9.

On the other hand, if the stress control film indicates compression stress, the drain current of the n-channel-type field effect transistor can be improved by thinning the n-channel type.

As described above in the first embodiment, the stress control film 192 and the stress control film 392 are made of silicon nitride (SiN). Therefore, they can also be used as etching stoppers when a contact hole is made in the interlayer dielectric 3 made of a silicon oxide film for electrical connection from the upper layer wiring to the source/drain area after forming the interlayer dielectric 3. The film is not limited to SiN.

Whether an insulated film indicates tensile stress or compression stress depends on the following process. That is, the semiconductor device is thinned from the substrate side or further from the laminated structure side of the insulated film with the above mentioned insulated film remained. If the remaining thin film warps with the substrate side set outside, then the film indicates tensile stress. On the other hand, if the remaining thin film warps with the substrate side set inside, then the film indicates compression stress.

The semiconductor device according to the first embodiment of the present invention shows an example of controlling the stress of a channel portion. The stress of the channel portion can be controlled by other means such as the following embodiments.

Figure 14:
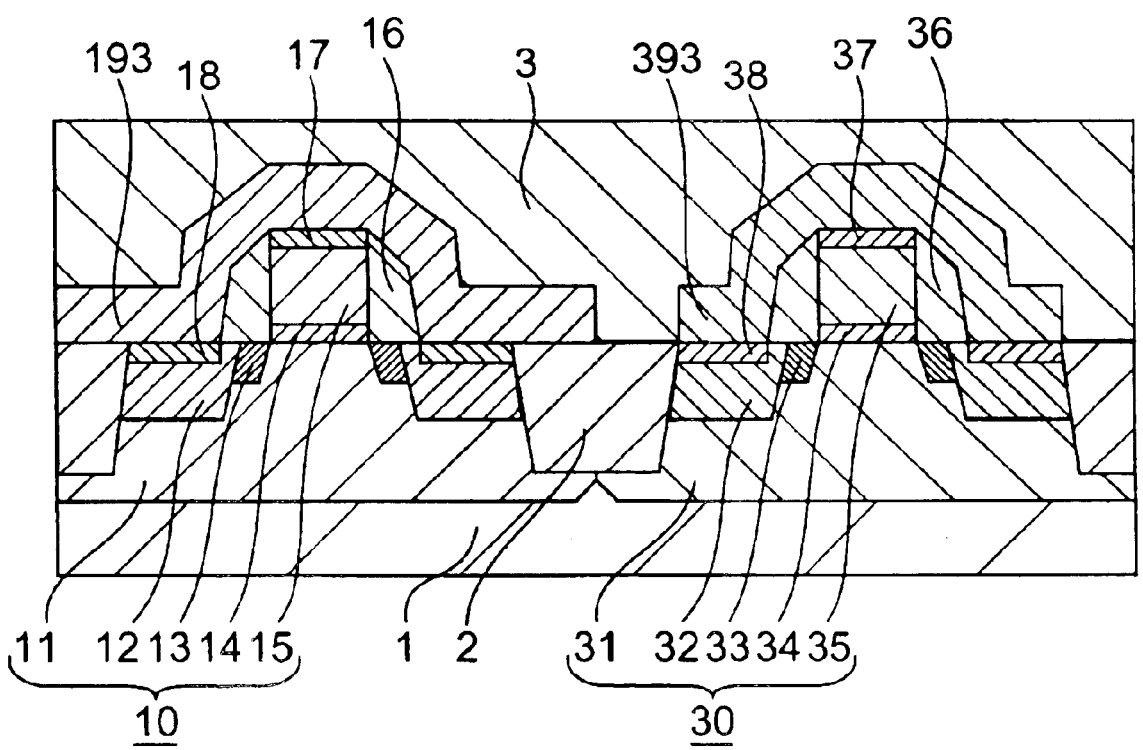
FIG. 14 is a schematic sectional view of a semiconductor device as a second embodiment of the present invention.
Figure 15:
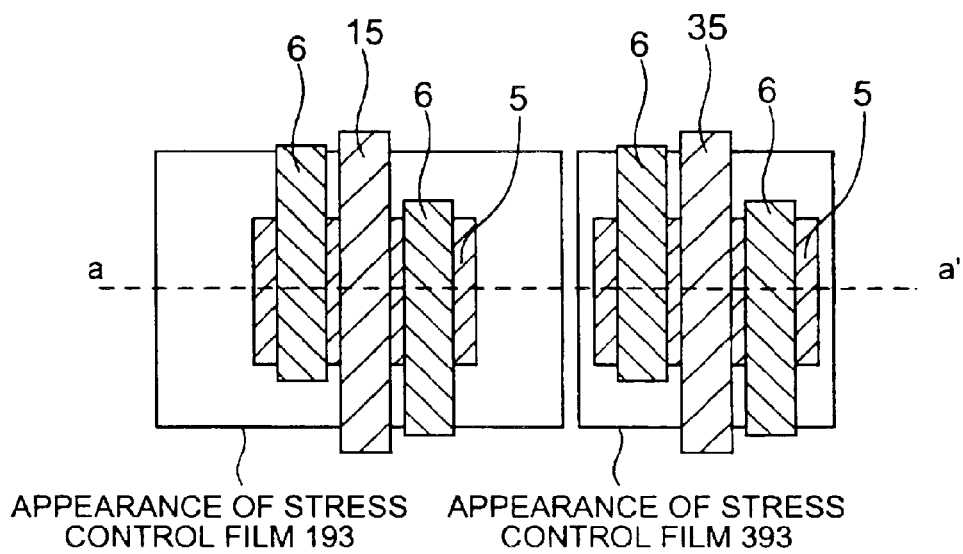
FIG. 15 is a schematic plan view of a semiconductor device as the second embodiment of the present invention.

The second embodiment of the present invention will be described below by referring to FIGS. 14 and 15. FIG. 14 is a typical view of the sectional (section along a line a–a' shown in FIG. 15) structure of the semiconductor device according to the second embodiment of the present invention. FIG. 15 is a typical top view of stress control films 193 and 393. In addition, FIG. 15 shows only the appearance of the gate electrodes 15 and 35, the wiring 6 connected to the source/drain, the active area 5 (transistor-forming area), and the stress control films 193 and 393. FIGS. 14 and 15 show the case in which the stress control films 193 and 393 indicate tensile stress.

The difference between the first and second embodiments is that, according to the second embodiment, the plan views of the stress control films 193 and 393 are different between the n-channel-type field effect transistor side and the p-channel-type field effect transistor side. As shown in FIG. 14, if the film stress of the stress control films 193 and 393 indicates tensile stress, then the area of the side portion of the gate electrode 35 of the stress control film 393 is smaller than the area of the side portion of the gate electrode 15 of the stress control film 193. On the other hand, if the film stress of the stress control films 193 and 393 indicates compression stress, then the area of the side portion of the gate electrode 35 of the stress control film 393 is larger than the area of the side portion of the gate electrode 15 of the stress control film 193.

It is more preferable that the areas of the n-channel-type field effect transistor and the p-channel-type field effect transistor are set larger in the extending direction of the gate electrodes 15 and 35 if the stress control films 193 and 393 indicate tensile stress (FIG. 15).

On the other hand, if the stress control films 193 and 393 indicate compression stress, then the areas of the n-channel-type field effect transistor and p-channel-type field effect transistor are set smaller in the extending direction of the gate electrodes 15 and 35 (omitted in the attached drawings).

According to the second embodiment of the present invention, the stress control films 193 and 393 are used as means for controlling the stress of the channel portions of the n- and p-channel-type field effect transistors. Other portions can be of any structure or material of any other embodiments than the second embodiment.

Described below will be the effect of the operation of the semiconductor device according to the second embodiment.

According to the second embodiment, the stress of the channel portion of a field effect transistor is controlled by the areas of the stress control films 193 and 393. If the stress control film extending toward the source/drain area indicates tensile stress, then strong tensile stress can be applied to the channel portion by enlarging the area in the n-channel type, and the stress of the channel portion can be reduced by reducing the area in the p-channel type as small as possible. On the other hand, if the stress control film indicates compression stress, the opposite processes are performed.

It is further preferable that, with respect to a direction perpendicular to a drain current in these transistors, the area is set large, tensile stress is applied to the channel of the field effect transistors, and the stress of the channel portion is reduced by setting the area smaller if the stress control film indicates compression stress.

Therefore, with the semiconductor device according to the second embodiment of the present invention, the stress of the channel portion can be tensile stress for the n-channel type rather than the p-channel type by the stress control films 193 and 393, thereby improving the drain current.

Furthermore, according to the second embodiment of the present invention, the stress can be controlled perpendicular to the channel. Therefore, the drain current can be further improved.

According to the second embodiment of the present invention, as described above, the stress control film 193 and the stress control film 393 are made of silicon nitride (SiN). Therefore, they can also be used as etching stoppers when a contact hole is made in the interlayer dielectric 3 made of a silicon oxide film for electrical connection from the upper layer wiring to the source/drain area after forming the interlayer dielectric 3.

The semiconductor device according to the second embodiment has the structure in which an n-channel-type field effect transistor and a p-channel-type field effect transistor are formed. According to the second embodiment, it is not necessary that the stress control films have to be discontinuous in the portion which is represented as having a larger area for a stress control film, and is formed by consecutive n- and p-channel-type field effect transistors.

Other embodiments will be described below by referring to FIGS. 10 to 13.

Figure 10:
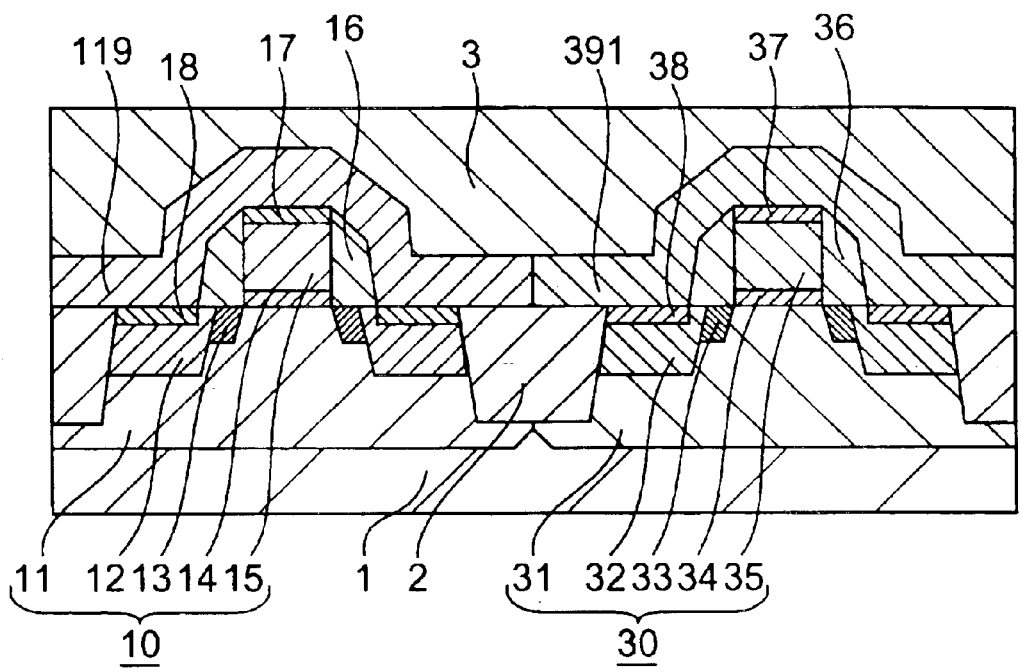
FIG. 10 is a schematic sectional view of a semiconductor device as a variation of the first embodiment of the present invention.
Figure 11:
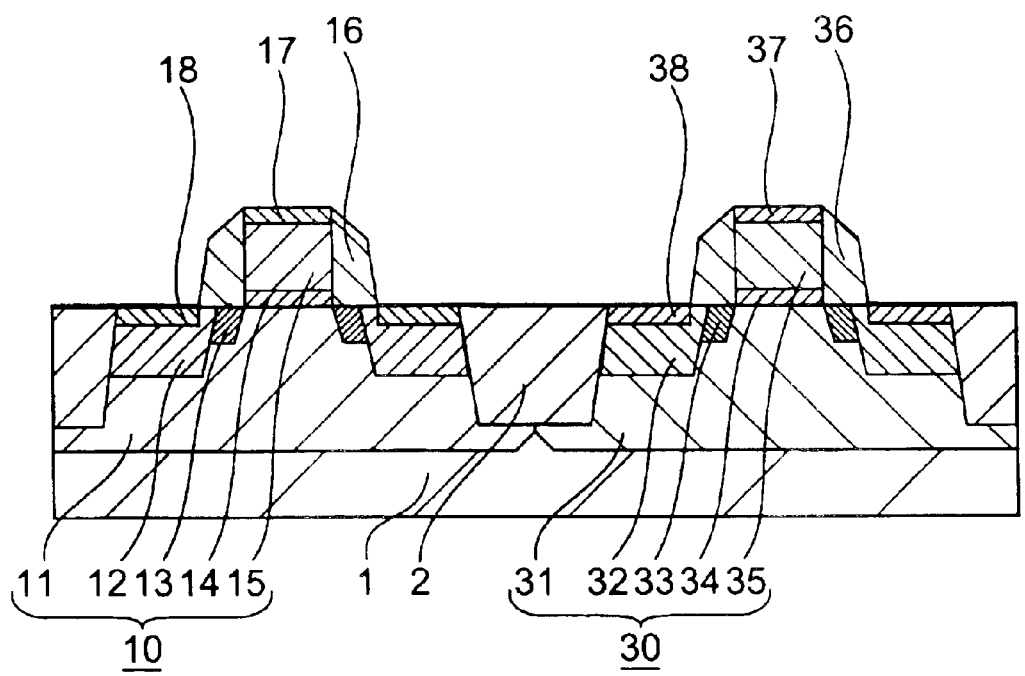
FIG. 11 is a schematic sectional view showing a part of a process of manufacturing the semiconductor device as the variation of the first embodiment of the present invention.
Figure 12:
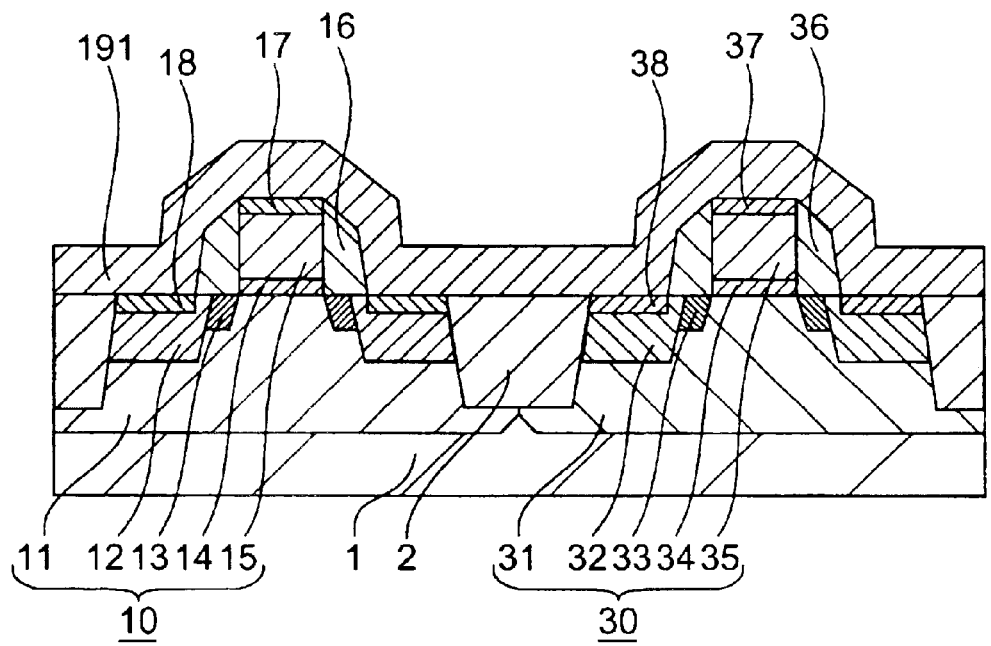
FIG. 12 is a schematic sectional view showing a part of the process of manufacturing the semiconductor device as the variation of the first embodiment of the present invention.
Figure 13:
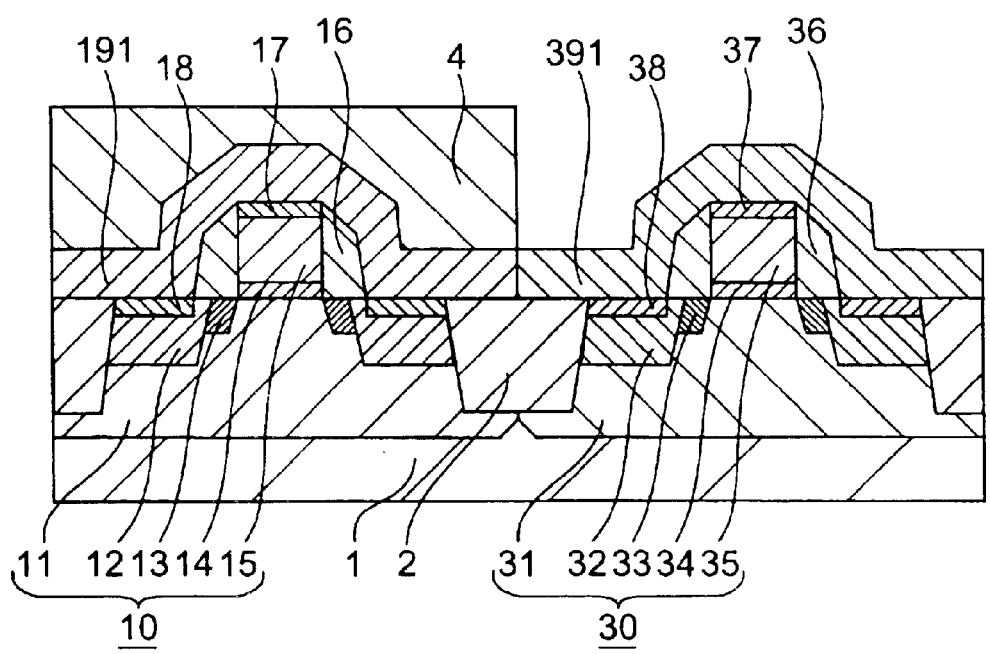
FIG. 13 is a schematic sectional view showing a part of the process of manufacturing the semiconductor device as the variation of the first embodiment of the present invention.

FIG. 10 shows the typical view of the sectional structure of the semiconductor device according to another embodiment of the present invention. FIGS. 11 to 13 are typical sectional views showing a part of the producing process of the semiconductor device according to the other embodiment.

The difference between the other embodiment and the first embodiment is that they have films of different compositions to have different film stress between stress control films 191 and 391.

According to the first embodiment, it is desired that an effect can be obtained without changing any composition of the film. However, the configuration is also preferable if the possibility of additional process of producing another composition can be accepted.

Practically, the stress control film 191 is mainly made of silicon nitride (SiN) while the stress control film 391 is made by excessively including at least one of silicon (Si), nitrogen (N), oxygen (O), germanium (Ge), argon (Ar), and helium (He) in the film similar to the stress control film 191.

According to another aspect of the first embodiment of the present invention, the stress control films 191 and 391 are used as means for controlling the stress of the channel portions of the n- and p-channel-type field effect transistors. Other portions can be of any structure or material of any other embodiments.

The producing process of the stress control films 191 and 391 of the semiconductor device according to the present embodiment can be, for example, as follows.

(1) The n-channel-type field effect transistor 10 and the p-channel-type field effect transistor 30 are formed on the main surface of the silicon substrate 1 to form the side walls 16 and 36, the silicide 17, 18, 37, and 38 (FIG. 11).

(2) A silicon nitride (SiN) film is formed as the stress control film 191 on the upper whole surfaces of the n- and p-channel-type field effect transistors in, for example, the spatter method, the chemical vapor growing method, etc. (FIG. 12).

(3) The surface of the p-channel-type field effect transistor other than its upper surface is covered with a mask 4 where inert element such as silicon (Si), germanium (Ge), or nitrogen (N), or oxygen (O), or argon (Ar), etc. is ion-implanted (FIG. 13).

(4) After removing the mask 4, the interlayer dielectric 3 is formed. Thus, the semiconductor device of the structure shown in FIG. 10 is produced.

Described below will be the effect of the operation of the semiconductor device according to the first embodiment of another aspect of the present invention.

According to the second embodiment of the present invention, an ion is implanted into the portion covering the p-channel-type field effect transistor after forming the stress control film 191 all over the upper surface (FIG. 12), and the atomic density of the film of the portion is higher than before the ion-implantation. As a result, the film stress of the stress control film 391 is shifted to the compressive side as compared with the stress control film 191.

Therefore, the channel face stress parallel to the drain current of the channel portion is also shifted to the compressive side, thereby obtaining the effect of improving the drain current of the p-channel-type field effect transistor.

In addition, according to another aspect of the first embodiment of the present invention, a silicon nitride (SiN) film which is the main element of the stress control film can be formed only once. According to the first embodiment, when silicon nitride (SiN) films having different film stress are formed, it is desired that two film-forming devices are provided, or one film-forming device is prepared with a different film-forming condition set for each film. If it is difficult to change the film-forming condition or a plurality of devices cannot be prepared, then another aspect of the present invention can be applied to use one film-forming device to improve the drain current of the n- and p-channel-type field effect transistors.

Thus, if, for example, there is different impurity concentrations between the stress control film 19 and the stress control film 39, then there can be different stress between the stress control film 19 and the stress control film 39, thereby additively requiring no new device.

As described in the first embodiment, the stress control film 191 and the stress control film 391 are made of silicon nitride (SiN). Therefore, they can also be used as etching stoppers when a contact hole is made in the interlayer dielectric 3 made of a silicon oxide film for electrical connection from the upper layer wiring to the source/drain area after forming the interlayer dielectric 3.

Figure 5:
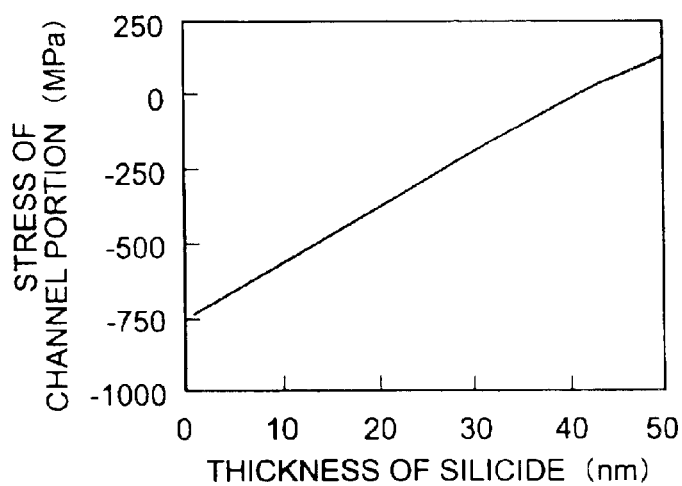
FIG. 5 is a graph showing the results of analysis of the effects of the thickness of silicide on the stress of the channel portion.

The third embodiment of the present invention will be described below by referring to FIGS. 16 and 5.

Figure 16:
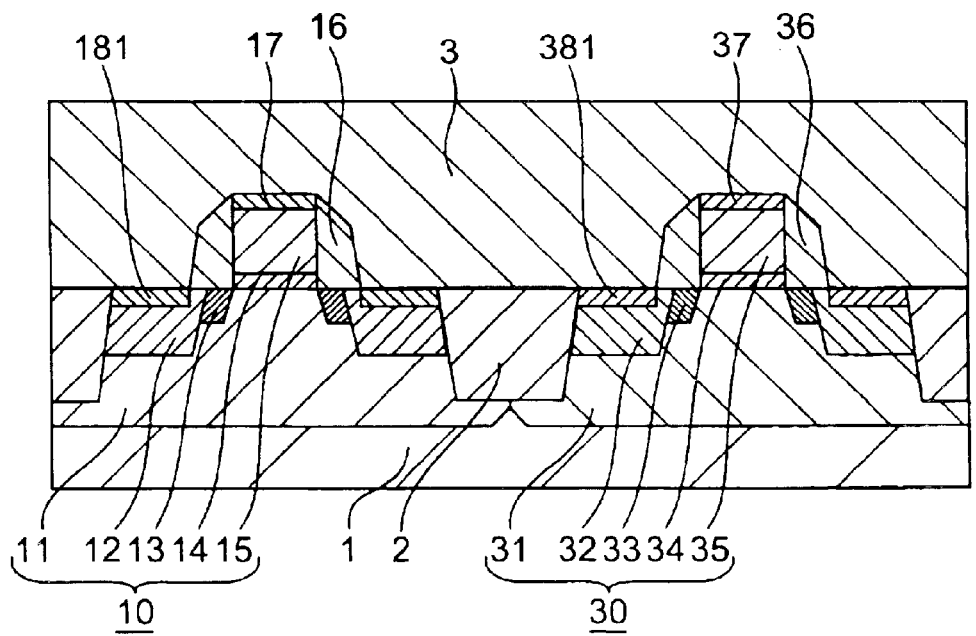
FIG. 16 is a schematic sectional view of a semiconductor device as a third embodiment of the present invention.

FIG. 16 is a typical sectional structure of the semiconductor device according to the third embodiment of the present invention. FIG. 5 is a graph showing the analysis result of the silicide film thickness dependence of the stress of the channel portion of the field effect transistor (channel face stress parallel to the drain current).

The difference between the third embodiment and the first embodiment is that the thickness of the film of a silicide 181 on the n-channel-type field effect transistor side is larger than that of a silicide 381 on the p-channel-type field effect transistor side. The silicide (titanium silicide, cobalt silicide, nickel silicide, etc.) can be obtained by first forming a film of titanium, cobalt, nickel, etc. in the spatter method, the chemical vapor growing method, etc., and performing a thermal treatment and silicide reaction. The stress control films 19 and 39 according to the first embodiment shown in FIG. 1 can be omitted.

According to the third embodiment of the present invention, the silicide layers 181 and 381 eare used as means for controlling the stress of the channel portions of the n- and p-channel-type field effect transistors, respectively. Other portions can be of any structure or material of any other embodiments than the third embodiment.

Described below will be the effect of the operation of the semiconductor device.

The silicide formed in the n- and p-channel-type field effect transistors is required to design an electrical connection between a contact plug and a transistor with low resistance, and is a material of generating strong tensile stress by a thermal treatment.

Therefore, the inventors of the present invention have applied the stress to the channel portion using the stress of the silicide to improve a drain current. FIG. 5 is a graph showing the analysis result of the silicide film thickness dependence of the stress of a channel portion. In FIG. 5, with an increasing thickness of a silicide film, the stress of a channel portion is shifted to a stronger tensile stress side.

According to the third embodiment, as shown in FIG. 16, the drain current of the n-channel-type field effect transistor can be improved by thickening the film of the silicide 181 of the n-channel-type field effect transistor, and the reduction of the drain current of the p-channel type can be avoided by thinning the film of the silicide 181 of the p-channel-type field effect transistor.

According to the third embodiment of the present invention, since the silicide required to form a complementary field effect transistor is used, it is not necessary to newly install a material, thereby utilizing the conventional production process.

The fourth embodiment of the present invention will be described by using FIGS. 17 and 6.

Figure 17:
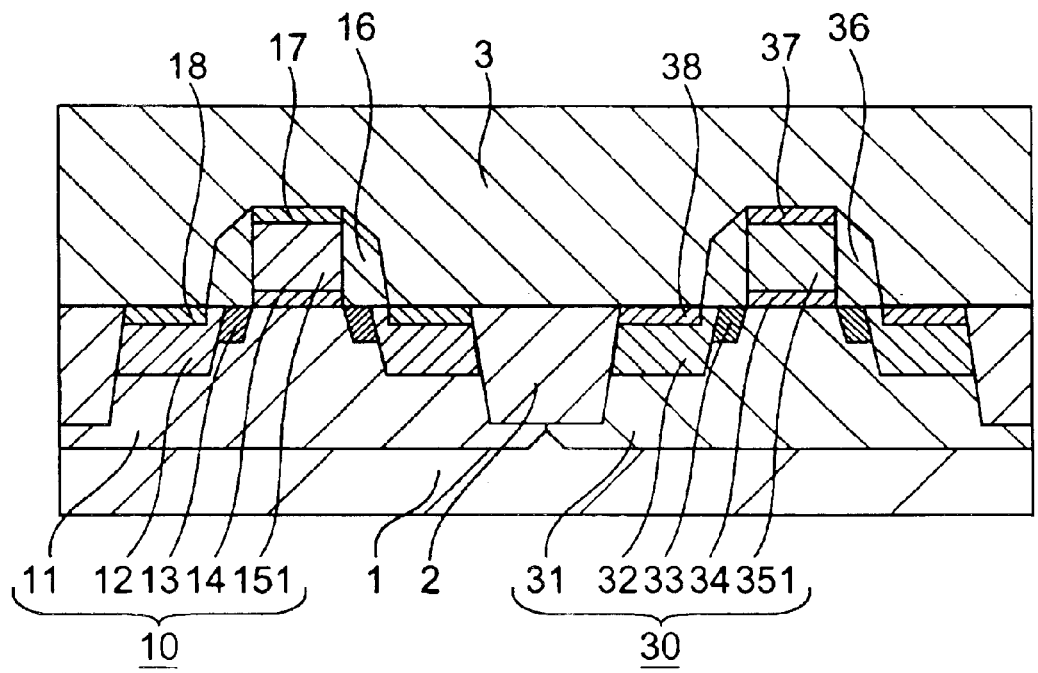
FIG. 17 is a schematic sectional view of a semiconductor device as a fourth embodiment of the present invention.

FIG. 17 is a typical view of the sectional structure of the semiconductor device according to the fourth embodiment of the present invention. FIG. 6 shows an analysis result of the gate electrode intrinsic stress dependence of the stress (channel face stress parallel to the drain current) of the channel portion.

The difference between the fourth and first embodiments is that the distribution of the impurity concentration of a gate electrode 151 of the n-channel-type field effect transistor 10 according to the fourth embodiment indicates the tilt perpendicular to the main surface of the silicon substrate 1, and the impurity of a gate electrode 351 of the p-channel-type field effect transistor 30 is uniform.

The gate electrode 151 according to the fourth embodiment can be obtained by ion-implantation of the impurity of phosphorus (P), boron (B), arsenic (As), etc. The gate electrode 351 can be formed by adding in advance the impurity of phosphorus (P), boron (B), arsenic (As), etc. According to the fourth embodiment, the stress control films 19 and 39 of the first embodiment shown in FIG. 1 can be omitted.

According to the fourth embodiment of the present invention, the gate electrodes 151 and 351 are used as means for controlling the stress of the channel portions of the n- and p-channel-type field effect transistors. Other portions can be of any structure or material of any other embodiments than the fourth embodiment.

Described below will be the effect of the operation of the semiconductor device.

Figure 6:
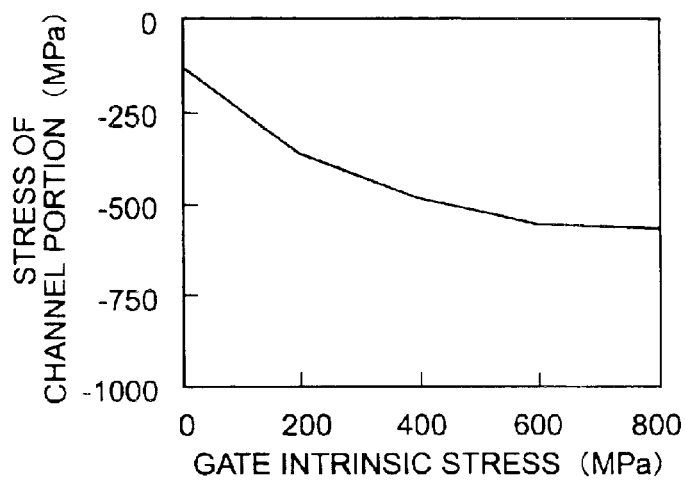
FIG. 6 is a graph showing the results of analysis of the effects of the intrinsic stress of a gate electrode on the stress of the channel portion.

FIG. 6 is a graph showing an analysis result of the gate electrode intrinsic stress dependence of the stress (channel face stress parallel to the drain current) of the channel portion. As shown in FIG. 6, when the intrinsic stress of the gate electrode is tensile stress, the stress of the channel portion is compression stress.

Normally, the polycrystalline silicon used for a gate electrode can be obtained by forming amorphous silicon with an impurity added, and performing a thermal treatment for crystallization and with a view to activating the added impurity. At this time, the tensile crystallization stress by the film contraction is generated. On the other hand, if the crystallization and thermal treatment are performed on the amorphous silicon without adding an impurity, then the crystallization stress, which is tensile stress, is generated. The stress is shifted to the compressive side if an impure element is then ion-implanted.

In the two above mentioned methods of forming a gate electrode, polycrystalline silicon in which the impurity is substantially uniformly distributed in the film is formed in the former method. In the latter method, polycrystalline silicon is formed with the impurity vertically distributed (Gaussian distribution, or the distribution in which the concentration is reduced perpendicular to the main surface of the silicon substrate 1) on the main surface of the silicon substrate 1.

According to the fourth embodiment, polycrystalline silicon of tensile stress having substantially uniform impurity concentration in the film is used for the gate electrode of the p-channel-type field effect transistor, and polycrystalline silicon having the stress on the compressive side as compared with the stress of the gate electrode of the n-channel type in which the impurity concentration decreases toward the silicon substrate 1 side is used for the gate electrode of the n-channel-type field effect transistor.

As a result, the stress of the channel portion of the n-channel-type field effect transistor is tensile stress as compared with the stress of the channel portion of the p-channel type, thereby improving the drain currents of both n- and p-channel types.

Additionally, according to the fourth embodiment of the present invention, since the gate electrode structure of the field effect transistor structure is used as means of controlling the stress of the channel portion, it is not necessary to newly install a material, and the conventional production process can be utilized.

The semiconductor device according to the fourth embodiment has means for controlling the stress of a channel portion using the stress of a gate electrode. Therefore, the material of the gate electrode is not limited to polycrystalline silicon. For example, it can be a metal material such as ruthenium (Ru), platinum (Pt), tungsten (W), titanium (Ti), titanium nitride (TiN), etc., or a laminated structure of the metal material and polycrystalline silicon. For example, a film of ruthenium Ru has strong tensile stress by the thermal treatment.

Then, a Ru film having high tensile stress is formed by a high temperature thermal treatment for the gate electrode of the p-channel-type field effect transistor, and a Ru film having low stress without the thermal treatment is formed for the gate electrode of the n-channel-type field effect transistor, thereby controlling the stress of the channel portions of both n- and p-channel types.

The fifth embodiment of the present invention will be described below by referring to FIGS. 18 to 21.

Figure 18:
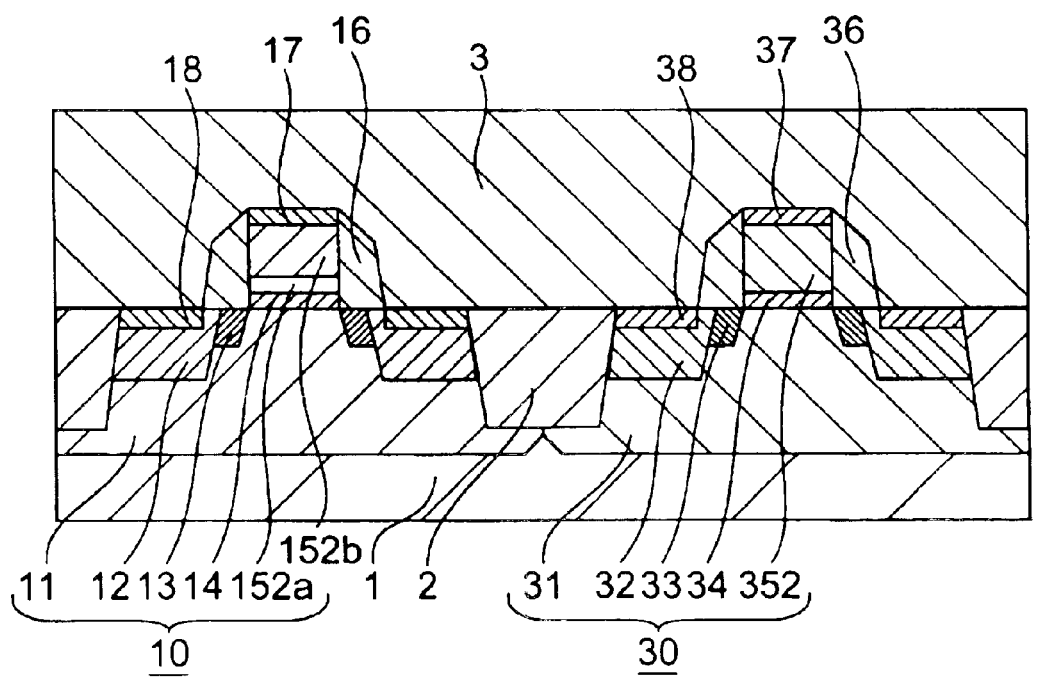
FIG. 18 is a schematic sectional view of a semiconductor device as a fifth embodiment of the present invention.
Figure 19:
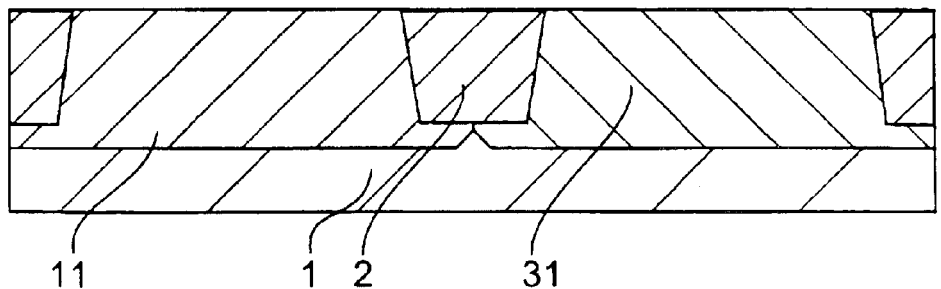
FIG. 19 is a schematic sectional view showing a part of a process of manufacturing the semiconductor device as the fifth embodiment of the present invention.
Figure 20:
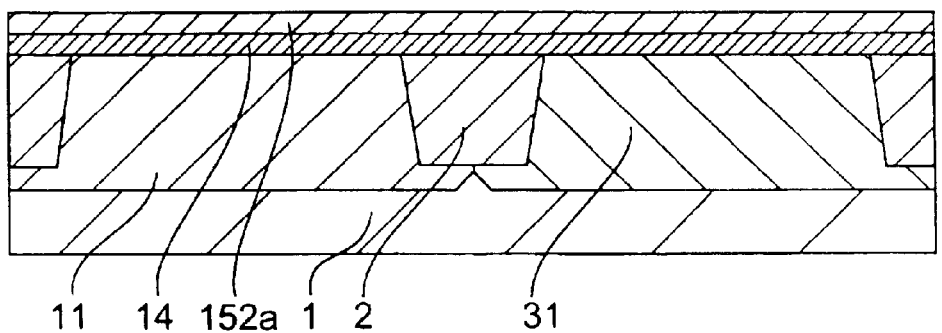
FIG. 20 is a schematic sectional view showing a part of the process of manufacturing the semiconductor device as the fifth embodiment of the present invention.
Figure 21:
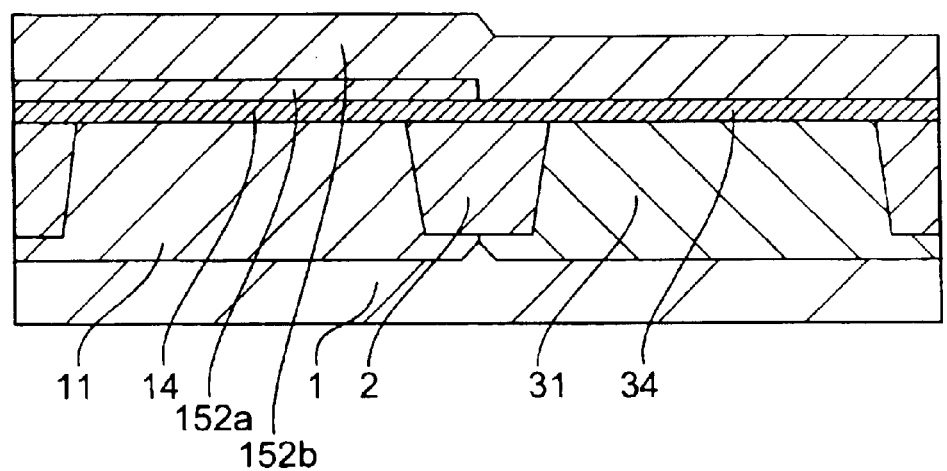
FIG. 21 is a schematic sectional view showing a part of the process of manufacturing the semiconductor device as the fifth embodiment of the present invention.

FIG. 18 is a typical view of the sectional structure of the semiconductor device according to the fifth embodiment of the present invention. FIGS. 19 to 21 are typical sectional views showing a part of the production process of the semiconductor device according to the fifth embodiment of the present invention.

The difference between the fifth and fourth embodiments is that the crystal grains configuring gate electrodes 152a and 152b of the n-channel-type field effect transistor 10 have plural layers of surfaces perpendicular to the silicon substrate 1, but the crystal grains configuring a gate electrode 352 of a p-channel type do not form a layer, or the crystal average particle size of the gate electrodes 152a and 152b of the n-channel type is smaller than the crystal average particle size of the gate electrode 352 of the p-channel type. According to the fifth embodiment, the stress control films 19 and 39 according to the first embodiment shown in FIG. 1 can be omitted.

According to the fifth embodiment of the present invention, the gate electrodes 152a, 152b, and 352 are used as means for controlling the stress of the channel portions of the n- and p-channel-type field effect transistors. Other portions can be of any structure or material of any other embodiments than the fifth embodiment.

The production process of the gate electrodes 152a, 152b, and 352 of the semiconductor device according to the fifth embodiment can be, for example, as follows.

(1) The shallow trench isolation 2, the p-type well 11 of the area of the n-channel-type field effect transistor 10, and the n-type well 31 of the area of the p-channel-type field effect transistor 30 are formed on the main surface of the silicon substrate 1 (FIG. 19).

(2) Then, the gate insulated film 14 and the gate electrode 152a are formed (FIG. 20).

(3) Then, the gate electrode 152a on the p-channel-type field effect transistor side is removed, and the gate electrode 152b is formed (FIG. 21).

(4) Next, the gate electrode is processed, the gate electrodes 152a and 152b of the n-channel-type field effect transistor, and the gate electrode 352 of the p-channel-type field effect transistor are formed, and the side walls 16 and 36, the source/drain 12, 13, 32, and 33, the silicide 17, 18, 37, and 38, and the interlayer dielectric 3 are formed (FIG. 18).

The effect of the operation of the semiconductor device according to the fifth embodiment will be described below.

When the silicon formed as amorphous silicon is heat-treated, tensile stress is generated with the growth of a crystal grain. Since the crystallization stress increases with the growth of the crystal grain, the crystallization stress can be suppressed by reducing the crystal average particle size.

Since the gate electrode 352 generating strong tensile stress of the p-channel-type field effect transistor is used according to the fifth embodiment of the present invention, the stress of the channel portion is compression stress. On the other hand, films are formed twice for the gate electrodes 152a and 152b of the n-channel-type field effect transistor, the crystal average particle sizes of the gate electrodes 152a and 152b become smaller, and the generated stress is reduced, thereby reducing the stress of the channel portion. As a result, the drain currents can be improved in both p- and n-channel-type field effect transistors.

It is not always necessary to form a film twice for the gate electrode of the semiconductor device according to the fifth embodiment, that is, the film can be formed two or more times. Otherwise, the gate electrodes of the n- and p-channel types can be formed in separate processes with the film-forming conditions, etc. changed such that the crystal grain can be smaller for the n-channel type and larger for the p-channel type.

Since the structure of the gate electrode in the structure of the field effect transistor is used as means for controlling the stress of the channel portion according to the fifth embodiment as in the fourth embodiment, it is not necessary to newly introduce a material, and the conventional process can be utilized.

Next, the sixth embodiment of the present invention will be described below by referring to FIGS. 22, 23 and 7.

Figure 22:
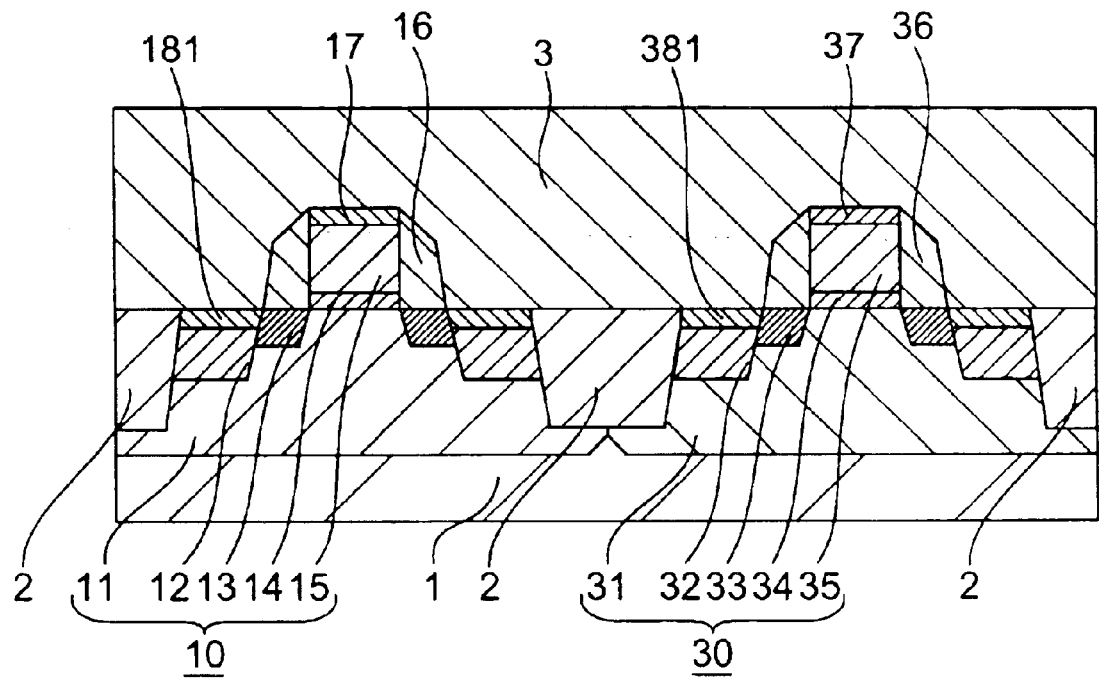
FIG. 22 is a schematic sectional view of a semiconductor device as a sixth embodiment of the present invention.

FIG. 22 is a typical view of the sectional structure (section along the line a–a' shown in FIG. 23) of the semiconductor device according to the sixth embodiment of the present invention. FIG. 23 is a typical top view showing difference between the n-channel-type field effect transistor and the p-channel-type field effect transistor in distance between a shallow groove device separation (STI) and the gate electrode.

Figure 23:
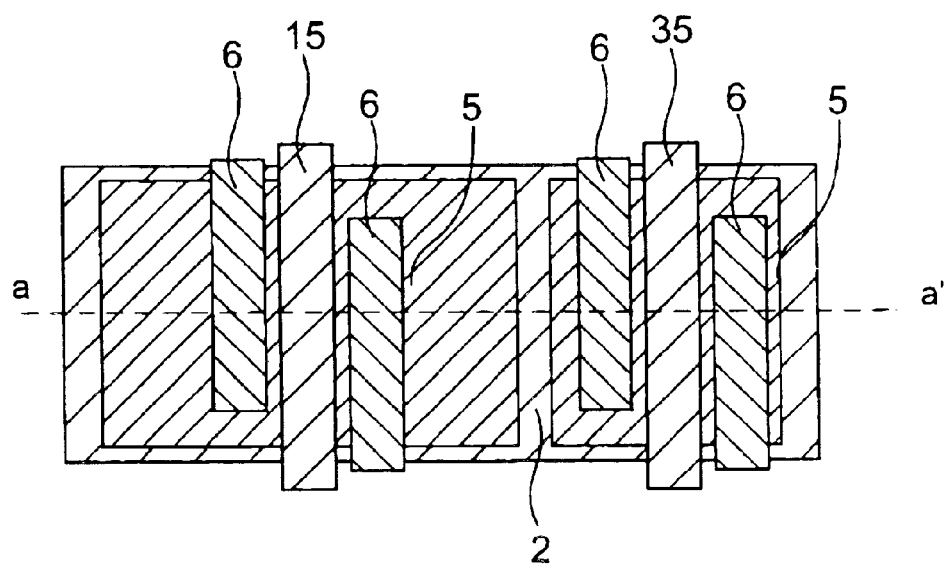
FIG. 23 is a schematic plan view of the semiconductor device as the sixth embodiment of the present invention.
Figure 24:
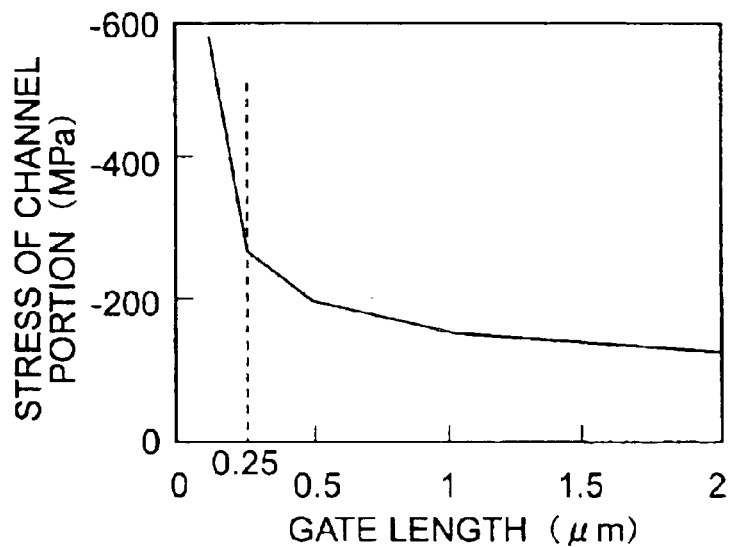
FIG. 24 is a graph showing the results of analysis of the stress of the channel portion of various transistor generations having corresponding gate lengths.
Figure 25:
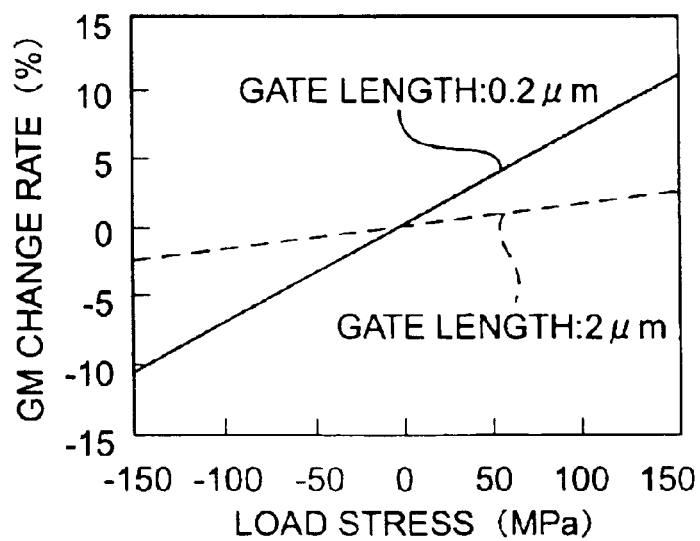
FIG. 25 is a graph showing the results of experiments showing differences in the dependency of mutual conductance (Gm) on stress between field effect transistor generations.

FIG. 23 shows only the shallow groove device separation 2, the gate electrodes 15 and 35, wiring 6 connected to the source/drain, an active area 5 (transistor forming area). FIG. 7 is a graph showing the analysis result of the STI oxidization causing stress dependence of the stress (channel face stress parallel to the drain current) of the channel portion.

The difference between the sixth and first embodiments is that the distance (distance parallel to the channel) from the gate electrode 15 of the n-channel-type field effect transistor 10 to the shallow groove device separation 2 is longer than the distance (distance parallel to the channel) from the gate electrode 35 of the p-channel-type field effect transistor 30 to the shallow groove device separation 2. In the sixth embodiment, the stress control films 19 and 39 according to the first embodiment shown in FIG. 1 can be omitted.

According to the sixth embodiment, the distance from the gate electrode 15 to the shallow groove device separation 2 and the distance from the gate electrode 35 to the shallow groove device separation 2 are used as means for controlling the stress of the channel portions of the n- and p-channel-type field effect transistors. Other portions can be of any structure or material of any other embodiments than the sixth embodiment.

Described below will be the effect of the operation of the semiconductor device according to the sixth embodiment.

Figure 7:
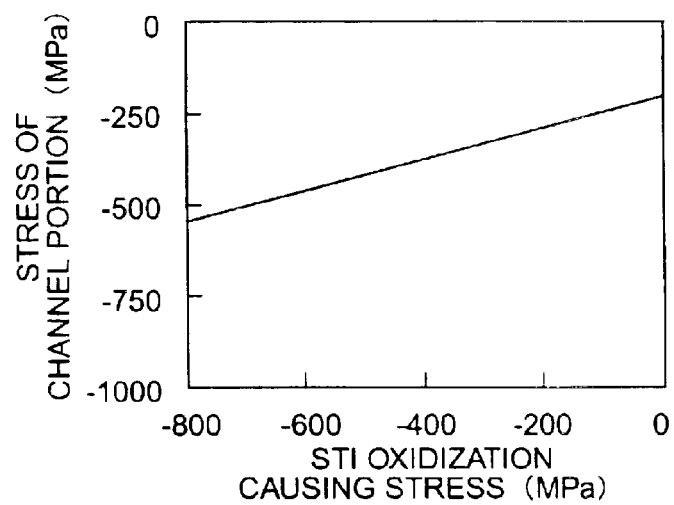
FIG. 7 is a graph showing the results of analysis of the effects of the oxidation-induced stress of STI on the stress of the channel portion.

FIG. 7 is a graph showing the analysis result of the STI oxidization causing stress dependence of the stress (channel face stress parallel to the drain current) of the channel portion. As shown in FIG. 7, when the STI oxidization causing stress is reduced, the high compression stress of the channel portion is reduced.

The STI is formed as enclosing the transistor forming area with a view to insulating the transistors. Since a shallow groove is made in the surface of the silicon substrate to embed a silicon oxide film into the groove, the volume expands in forming the silicon oxide film and high compression stress is generated in an active area if there is an oxidizing process in the production process.

As a result of the above mentioned processes, it is certain that the stress of the channel portion largely depends on the stress of the STI.

According to the sixth embodiment of the present invention, the channel portion of the n-channel-type field effect transistor is formed in the distance from the STI. On the other hand, the channel portion of the p-channel-type field effect transistor is formed near the STI. Since the compression stress by the STI can be reduced away from the STI, the stress of the channel portion of the n-channel-type field effect transistor is reduced while the stress of the channel portion of the p-channel-type field effect transistor can be high compression stress.

As a result, the drain currents of both n- and p-channel types can be improved, thereby successfully improving the entire performance.

Since the sixth embodiment of the present invention requires only a change in layout, the conventional production process can be utilized as is.

As for the distance to the STI of the longitudinal direction of the gate electrodes 15 and 35, it is desired that the distance from the STI to the channel is longer for both n- and p-channel types. It is more preferable that the p-channel type is larger than the n-channel type.

Additionally, in the semiconductor device according to the sixth embodiment, the distances from the STI to the channel are different between the n-channel type and the p-channel type. In the embodiments other than the sixth embodiment, the similar effect can be obtained by having a broader groove width of the STI parallel to the channel in the n-channel-type field effect transistor, and by having a narrower groove width in the p-channel-type field effect transistor.

In this case, it is preferable that the groove width of the STI perpendicular to the channel is broad in either field effect transistor.

As described above, according to the sixth embodiment, the drain current can be successfully increased. Additionally, according to the sixth embodiment, a semiconductor device can be realized at a lower production cost.

Next, the seventh embodiment of the present invention will be described below by referring to FIGS. 26 and 27.

Figure 26:
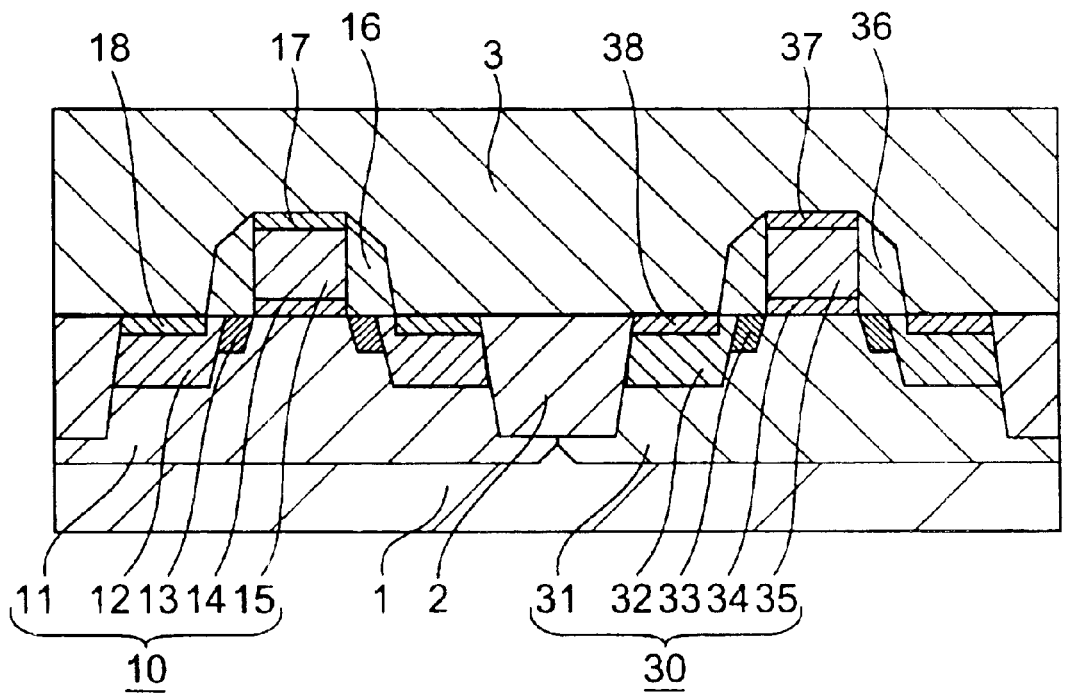
FIG. 26 is a schematic sectional view of a semiconductor device as a seventh embodiment of the present invention.

FIG. 26 is a typical view of the sectional structure of the semiconductor device according to the seventh embodiment of the present invention. FIG. 27 is a graph showing an analysis result of the side wall film stress dependence of the stress of the channel portion of the field effect transistor.

The difference between the seventh and first embodiments of the present invention is that the quality of the film of the side wall 16 on the n-channel-type field effect transistor side is different from the quality of the film of the side wall 36 on the p-channel-type field effect transistor side.

Practically, the film stress of the side wall 16 on the n-channel-type field effect transistor side is on the tensile stress side as compared with the side wall 36 of the p-channel-type field effect transistor side. That is, the tensile stress of the side wall 16 is larger than the tensile stress of the side wall 36. It is desired that the main element of the side walls 16 and 36 is silicon nitride, but is not limited to it.

It is also desired that the side walls 16 and 36 are single-layer films, but can be the laminated structure of silicon nitride, silicon oxide, etc. According to the first embodiment of the present invention, the stress control films 19 and 39 are formed. According to the seventh embodiment shown in FIG. 26, the stress control films 19 and 39 can be omitted.

According to the seventh embodiment, the side walls 16 and 36 are used as means for controlling the stress of the channel portions of the n- and p-channel-type field effect transistors. Other portions can be of any structure or material of any other embodiments than the seventh embodiment.

Described below will be the effect of the operation of the semiconductor device of the seventh embodiment.

Figure 27:
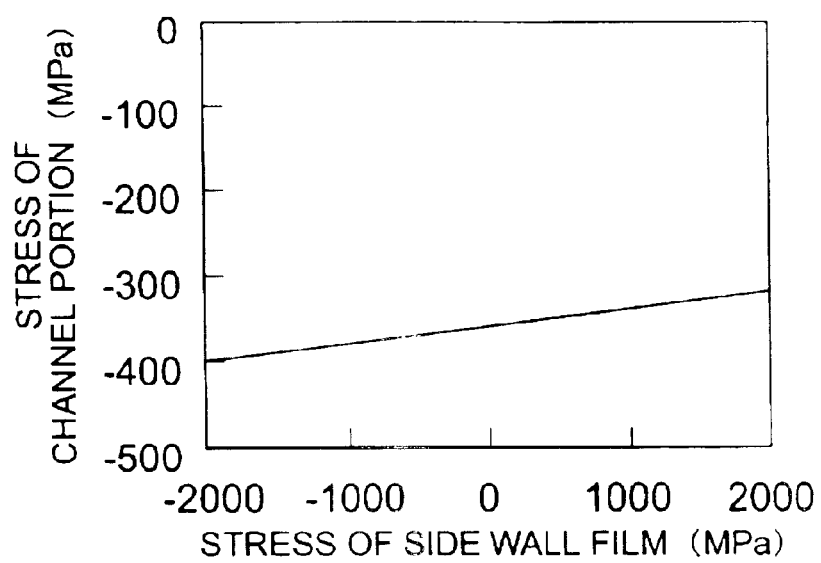
FIG. 27 is a graph showing the results of analysis of the effects of the film stress of a side wall on the stress of the channel portion.

The analysis result shown in FIG. 27 is a result obtained by assuming the silicon nitride as a side wall film. As shown in FIG. 27, the stress of the channel portion is also shifted to the tensile stress side as the film stress of the side wall comes on the tensile stress side.

According to the seventh embodiment, the film having the stress on the tensile stress side is used for the side wall 16 of the n-channel-type field effect transistor, and the film having the stress on the compression stress side as compared with the film of the n-channel type is used for the side wall 36 of the p-channel-type field effect transistor. Thus, the drain currents of both n- and p-channel-type field effect transistors can be improved. Therefore, the entire characteristics can be improved.

Furthermore, the difference in film stress can be informed of by the quality of a film (density), etc., and the film stress is closer to the compressive side if the film is higher in density.

The eighth embodiment of the present invention will be described below by referring to FIGS. 28 and 29.

Figure 28:
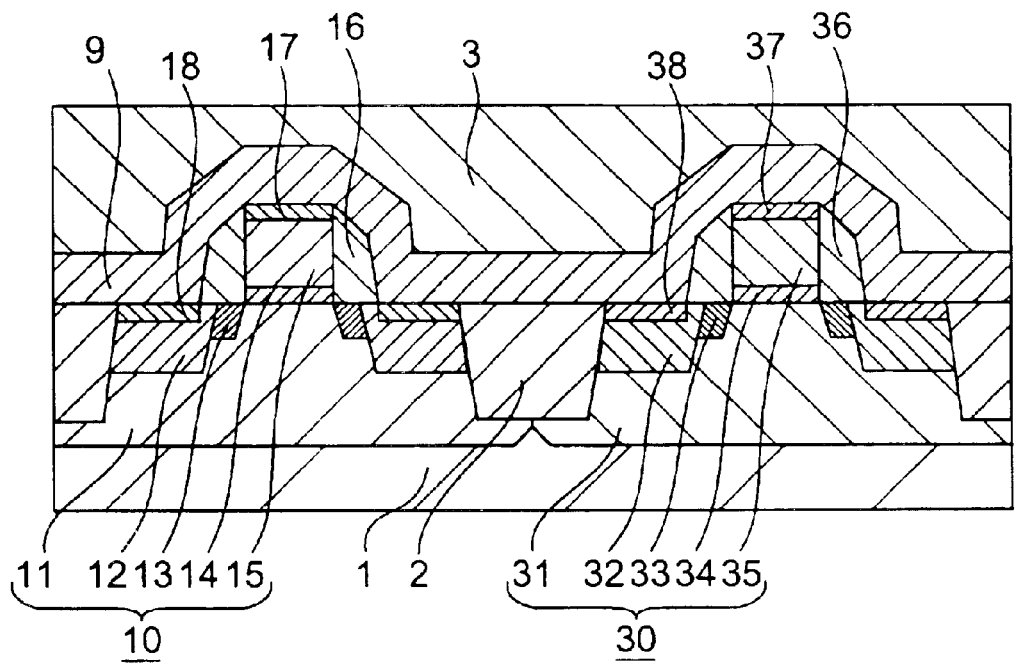
FIG. 28 is a schematic sectional view of a semiconductor device as an eighth embodiment of the present invention.

FIG. 28 are typical view of the sectional structure of the semiconductor device according to the eighth embodiment of the present invention. FIG. 29 is a graph showing an analysis result of the side wall film stress dependence of the stress of the channel portion of the field effect transistor.

The difference between the eighth and first embodiments is that as shown in the first embodiment a stress control film 9 is not provided with any different film stress between the n-channel-type field effect transistor and the p-channel-type field effect transistor.

Then, according to the eighth embodiment, if the film stress of the stress control film 9 is tensile stress, then the average Young's modulus of the side wall 16 is higher than the average Young's modulus of the side wall 36. For example, the side wall 16 is mainly formed of silicon nitride, and the side wall 36 is mainly formed of silicon oxide.

On the other hand, if the film stress of the stress control film 9 is compression stress, then the average Young's modulus of the side wall 16 is lower than the average Young's modulus of the side wall 36. For example, the side wall 16 is mainly formed of silicon oxide, and the side wall 36 is mainly formed of silicon nitride.

The side walls 16 and 36 can be formed by a laminated structure of a plurality of materials. The eighth embodiment is based on the phenomenon that the stress of the film covering the gate electrode and the side wall over the upper surface is transmitted or not transmitted to the channel portion by the Young's modulus of the side wall (rigidity).

Therefore, the film covering a gate electrode or a side wall is important, and the stress control film 9 can be omitted. However, since there is the case in which the stress of the interlayer dielectric 3 can work on the side walls 16 and 36, the Young's modulus of the side wall 16 can be higher than the Young's modulus of the side wall 36 if the stress control film 9 is omitted and the stress of the interlayer dielectric 3 is tensile stress, and the Young's modulus of the side wall 16 can be lower than the Young's modulus of the side wall 36 if the stress of the interlayer dielectric 3 is compression stress.

According to the eighth embodiment, the side walls 16 and 36, and a film covering the gate electrode and the side wall over the upper surface are used as means for controlling the stress of the channel portions of the n- and p-channel-type field effect transistors. Other portions can be of any structure or material of any other embodiments than the eighth embodiment.

Described below will be the effect of the operation of the semiconductor device according to the eighth embodiment.

Figure 29:
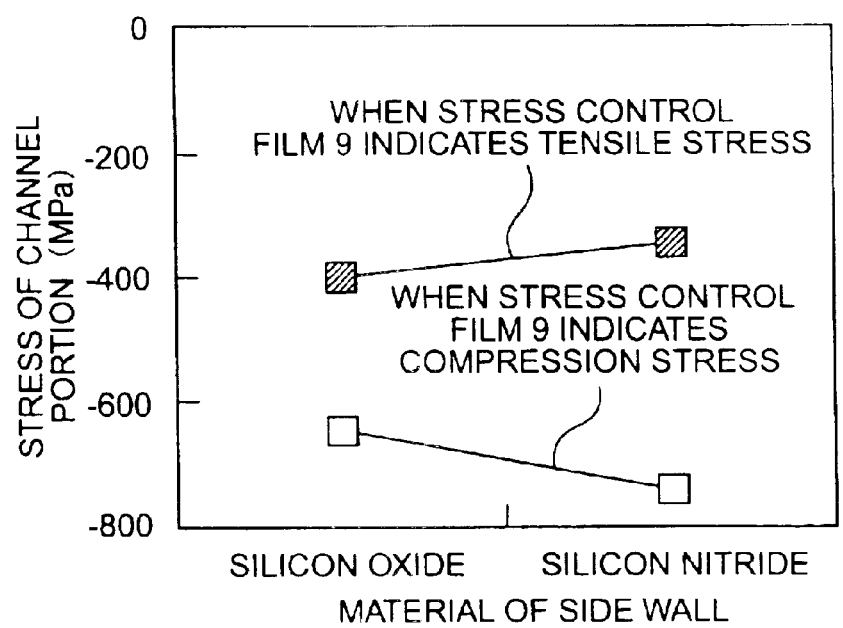
FIG. 29 is a graph showing the results of analysis of the effects of the material of the side wall on the stress of the channel portion.

FIG. 29 is a graph showing an analysis result of the side wall film stress dependence of the stress of the channel portion. The result shown in FIG. 29 is obtained by performing computation by assuming silicon oxide as a material having a low Young's modulus and silicon nitride as a material having a high Young's modulus.

As shown in FIG. 29, when the case in which the material of a side wall is silicon oxide is compared with the case in which the material of a side wall is silicon nitride, the stress is higher on the tensile stress side when silicon nitride is used if the stress control film 9 indicates tensile stress while the stress is higher on the tensile stress side when silicon oxide is used if the stress control film 9 indicates compression stress.

According to the eighth embodiment, silicon nitride is used for the side wall 16 of the n-channel-type field effect transistor when the stress control film 9 indicates tensile stress, and silicon oxide is used for the side wall 36 of the p-channel-type field effect transistor.

On the other hand, silicon oxide is used for the side wall 16 of the n-channel-type field effect transistor when the stress control film 9 indicates compression stress, and silicon nitride is used for the side wall 36 of the p-channel-type field effect transistor.

Therefore, the drain currents of both n- and p-channel-type field effect transistors can be improved. Thus, the entire characteristics can be improved.

The Young's modulus of the film can be measured by a microforce test, etc.

The ninth embodiment of the present invention is described below by referring to FIG. 30.

Figure 30:
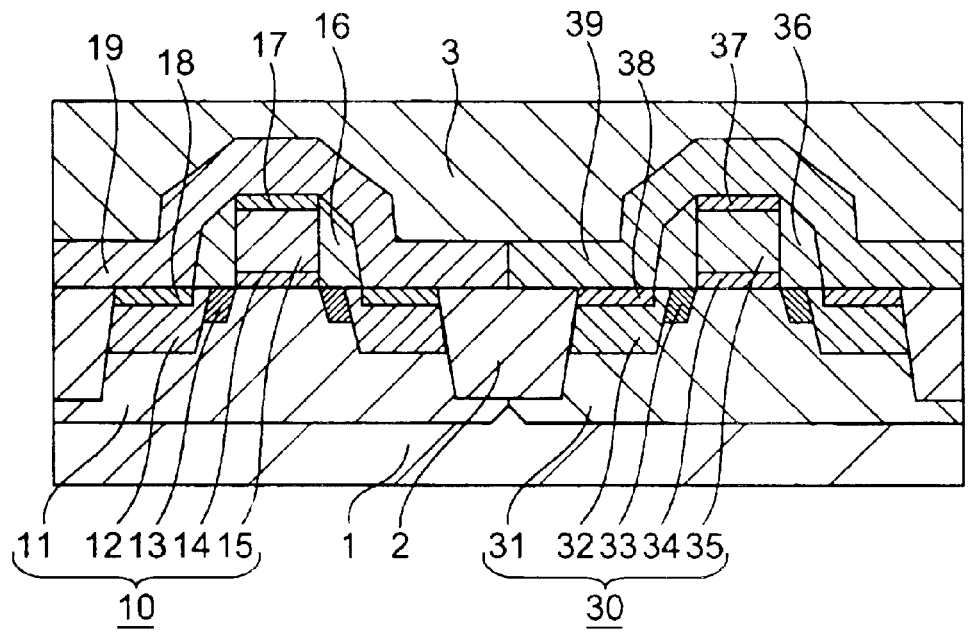
FIG. 30 is a schematic sectional view of a semiconductor device as a ninth embodiment of the present invention.

FIG. 30 is a typical view of the sectional structure of the semiconductor device according to the ninth embodiment of the present invention.

The ninth embodiment is characterized by comprising the combination that, if the film stress of the stress control film 19 is tensile stress, and the film stress of the stress control film 39 is compression stress, then the film stress of the side wall 16 is tensile stress, and the film stress of the side wall 36 is compression stress.

It is desired that the stress control films 19 and 39 are films mainly of silicon nitride, but are not limited to the material.

It is also desired that the side walls 16 and 36 are films of silicon nitride, but can also have a laminated structure of silicon oxide, etc. or can be of any other materials.

According to the ninth embodiment, the stress control films 19 and 39, and the side walls 16 and 36 are used as means for controlling the stress of the channel portions of the n- and p-channel-type field effect transistors. Other portions can be of any structure or material of any other embodiments than the ninth embodiment.

Described below will be the effect of the operation of the semiconductor device according to the ninth embodiment.

According to the ninth embodiment, as described above by referring to the first embodiment, since the stress control film 19 indicates tensile stress and the stress control film 39 indicates compression stress, the drain currents of both n- and p-channel-type field effect transistors can be improved.

Furthermore, according to the ninth embodiment, as described above by referring to the eighth embodiment, the drain currents of both n- and p-channel-type field effect transistors can be further improved by using a side wall of a material having a higher Young's modulus, for example, silicon nitride.

According to the ninth embodiment, as described above by referring to the seventh embodiment, the drain currents of both n- and p-channel-type field effect transistors can be further improved by the side wall 16 indicating tensile stress, and the side wall 36 indicating compression stress.

Furthermore, the stress control film 19 and the side wall 16 can be formed on the same film-forming conditions, and the stress control film 39 and the side wall 36 can be formed on the same film-forming conditions, thereby simplifying the production process.

The above mentioned examples are described with the contact plug omitted except the example shown in FIG. 31, but the stress can be varied between the n-channel type and the p-channel type by changing the shape of the contact plug formed on the n-channel-type field effect transistor side and the shape of the contact plug formed on the p-channel-type field effect transistor.

Figure 32:
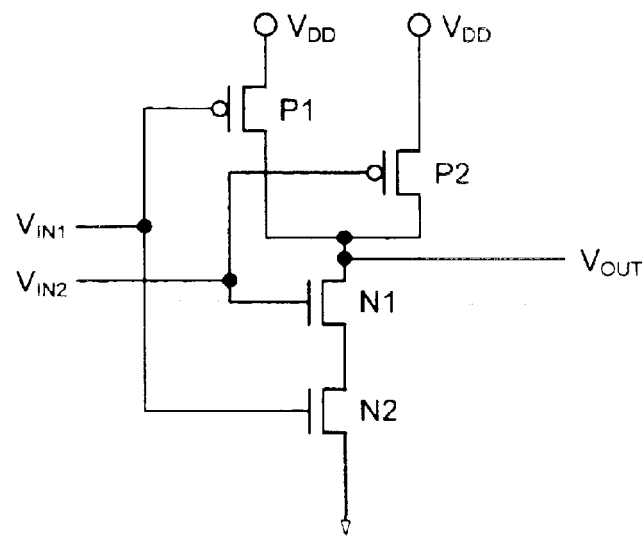
FIG. 32 is an electric circuit diagram of a semiconductor device as a tenth embodiment of the present invention.
Figure 33:
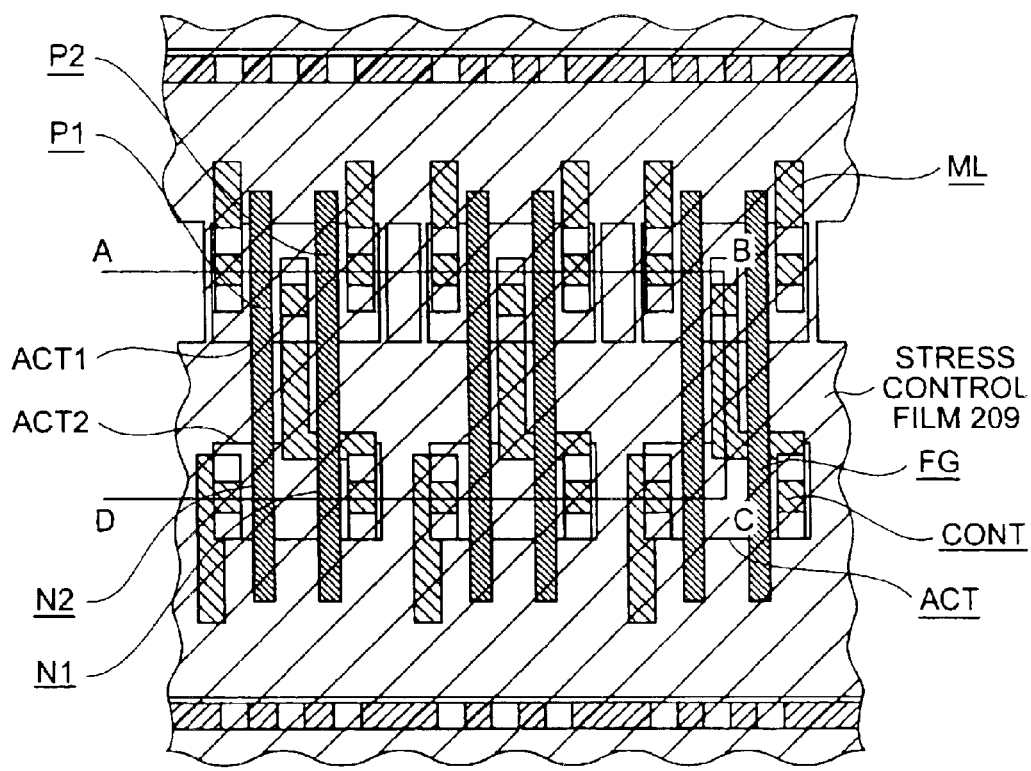
FIG. 33 is a schematic plan view (partially enlarged view of FIG. 34) of the tenth embodiment of the present invention.
Figure 34:
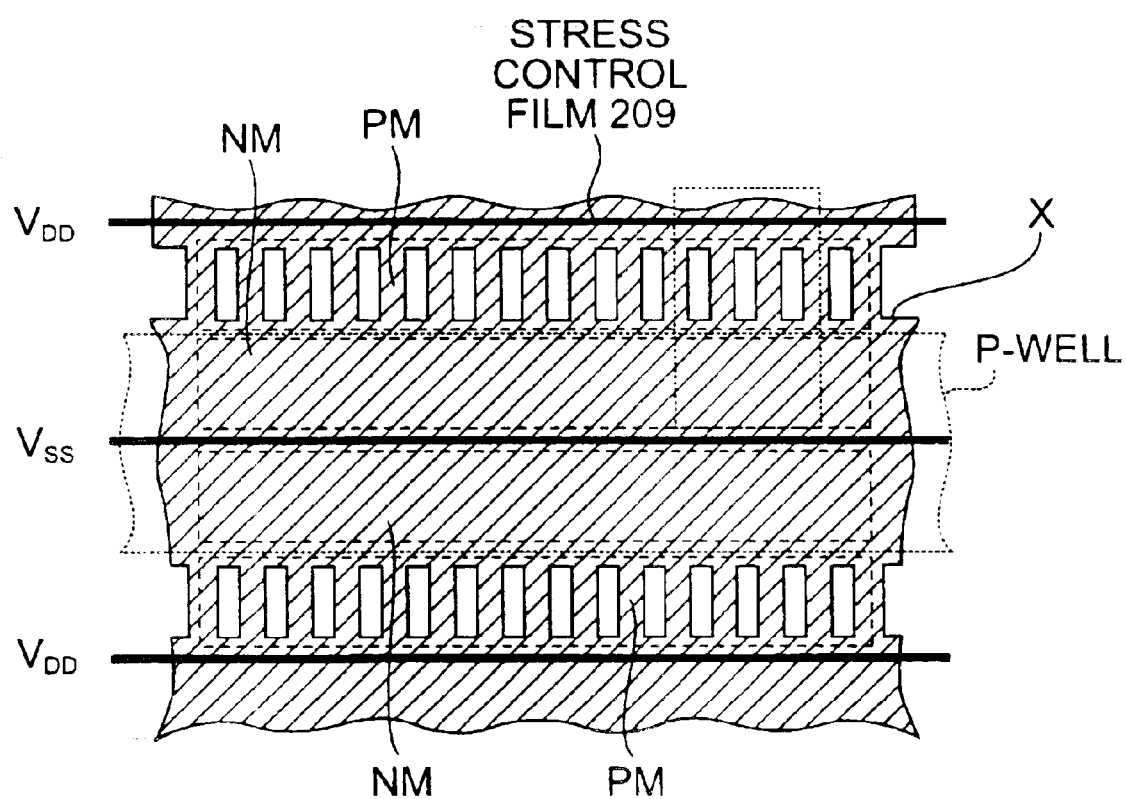
FIG. 34 is a schematic plan view of the tenth embodiment of the present invention.
Figure 35A:
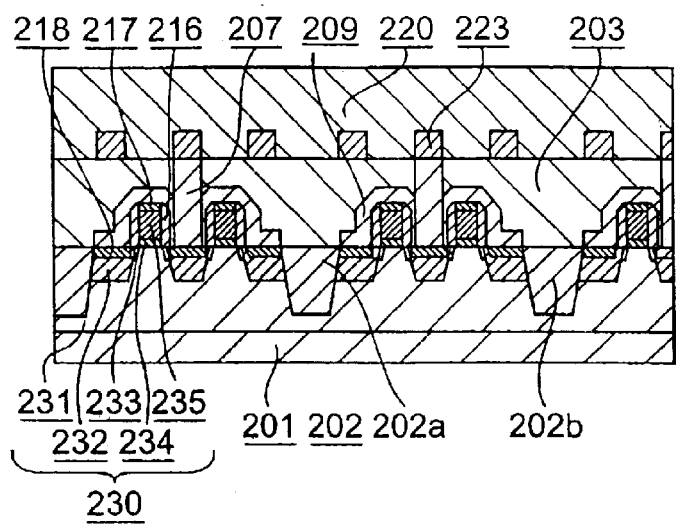
FIGS. 35A, 35B, and 35C are schematic sectional views of the tenth embodiment of the present invention.
Figure 35B:
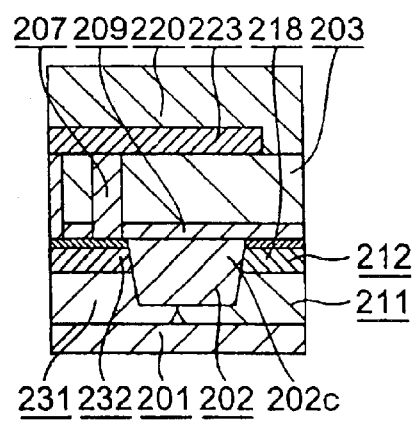
Figure 35C:
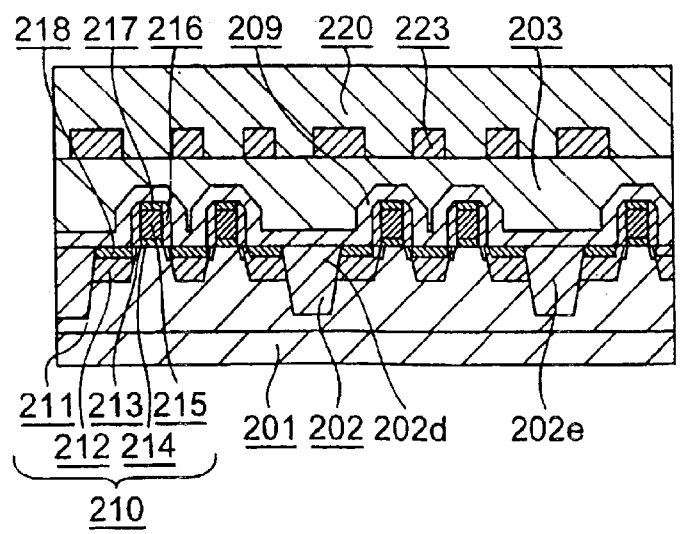

The tenth embodiment of the present invention will be described by referring to FIGS. 32 to 35. This embodiment is an example of applying an actual device circuit with the direction perpendicular to the channel taken into account when the stress control film 9 has film stress indicating tensile stress according to the second embodiment. FIG. 2 shows an experiment result of the stress dependence of the drain current of the n- and p-channel-type field effect transistors. FIG. 32 shows an electric circuit of a 2NAND circuit to which the present invention is applied. FIGS. 33 and 34 are typical plan views of the layout of the semiconductor device according to the present invention (FIG. 33 is a typical view obtained by enlarging a part (indicated by the frame X) of FIG. 34). FIG. 35 is a typical view of the structure of the section between A and D in the plan view of the layout shown in FIG. 33.

The electric circuit to which the present invention is applied is a 2NAND circuit comprising two p-channel-type field effect transistors P1 and P2, and two n-channel-type field effect transistors N1 and N2 as shown in FIG. 32. These transistors N1, N2, P1, and P2 respectively correspond to the transistors N1, N2, P1, and P2 shown in FIG. 33.

One 2NAND circuit comprises, as shown in FIG. 33, a p-channel-type field effect transistor P1 and an n-channeltype field effect transistor N2 sharing the gate electrode FG, similarly a P2 and N1, a contact plug CONT for electrical connection of the respective transistors, and wiring ML. The p-channel-type field effect transistors P1 and P2 are formed on one active ACT1, and the n-channel-type field effect transistors N1 and N2 are formed on one active ACT2.

The semiconductor device according to the present embodiment includes a plurality of 2NAND circuits arranged in series in a repetitive pattern. That is, as shown in FIG. 34, the device is configured by an area NM in which n-channel-type field effect transistors are continuously arranged by repeatedly arranging the p-channel-type field effect transistors P1 and P2 and the n-channel-type field effect transistors N1 and N2, and an area PM in which p-channel-type field effect transistors are repeated.

In this embodiment, the stress control film described in the second embodiment indicates tensile stress, and the n- and p-channel-type field effect transistors are formed as shown in the plane patterns shown in FIGS. 33 and 34 respectively. That is, in the stress control films covering the entire circuit layout, the stress control films in the drain current direction of the p-channel-type field effect transistors are discontinuous in the field enclosed by the active of the p-channel-type field effect transistors. (In the transistor circuit shown in FIG. 33, a stress control film 209 is continuously formed over other elements for the portion other than the field enclosed by the active of the p-channel-type field effect transistor, in the longitudinal direction of the gate electrode of the transistor, and the continuous direction of the n-channel-type field effect transistor.)

Macroscopically, as shown in FIG. 34, in the area PM where a number of p-channel-type field effect transistors are formed, a slit (a portion where a film is discontinuous) is formed in the stress control film 209.

FIG. 35 is a typical view of the sectional structures A to D in the layout of the plan view shown in FIG. 33. As in the second embodiment, the semiconductor device according to the present embodiment is configured by a n-channel-type field effect transistor 210 and a p-channel-type field effect transistor 230 formed on the main surface of a silicon substrate 201, and the stress control film 209 formed on the transistors.

The n-channel-type field effect transistor is configured by an n-type source/drain (212, 213) formed on a p-type well 211, a gate insulated film 214, and a gate electrode 215. Silicide 217 and 218 are formed on the upper surfaces of the gate electrode 215 and the n-type source/drain (212, 213). The p-channel-type field effect transistor is configured by a p-type source/drain (232, 233) formed on an n-type well 231, the gate insulated film 34, and the gate electrode 35. Silicide 237 and 238 are formed on the upper surfaces of a gate electrode 235 and the p-type source/drain (232, 233). Side walls 216 and 236 are formed on the side walls of the gate insulated films 214 and 234, the gate electrodes 215 and 235, and the silicide 217, 218, 237, and 238. These transistors are insulated from other transistors by shallow groove device separation 202.

The stress control film 209 is formed on the upper surfaces of the n- and p-channel-type field effect transistors, on which wiring 223 and an interlayer insulated film 203 are formed by electrical connection by a contact plug 207.

The material and the film-forming method according to the first embodiment are used for the stress control film 209 whose film stress is tensile stress. On the section (section A-B shown in FIG. 34, and FIG. 35A) across the source/drain of the p-channel-type field effect transistor, a discontinuous portion is formed in the shallow groove device separation, and the stress control film is discontinuous between the transistors adjacent with the shallow groove device separation, for example, 202a between them. On the other hand, on the section (section C-D shown in FIG. 34, and FIG. 35C) across the n-channel-type field effect transistor, the stress control film is continuous between adjacent transistors. That is, the stress control film is continuous on the shallow groove device separation, for example, 202d and 202e.

As shown on the section B-C shown in FIG. 34, and in FIGS. 3–5B, the stress control film 209 is formed on the shallow groove device separation in the gate electrode longitudinal direction of the n- and p-channel-type field effect transistors, for example, on 202c, and becomes continuous with the stress control film on the transistor in the gate electrode longitudinal direction or on another device.

The 2NAND circuit according to the present embodiment is an example to which the present invention is applied to the layout of an actual electric circuit. The layout in the plan view can be of any embodiment other than the present embodiment, and the applicable electric circuit can be, for example, an AND circuit, a NOR circuit, an OR circuit, or an input/output buffer circuit. The structure, material, manufacturing method of a portion other than the stress control film can be anything other than those according to the present embodiment.

Described below will be the effect of the operation of the present embodiment. As described in the second embodiment, the stress of the channel portion of a field effect transistor can be controlled by the size of the area of the stress control film 9. In FIG. 14 showing the second embodiment, the stress parallel to the channel is optimized by the n- and p-channel-type field effect transistors.

As shown in FIG. 2, the drain currents of the n- and p-channel-type field effect transistors largely depend on the stress perpendicular to the channel as well as the stress parallel to the channel. The n-channel-type field effect transistor increases by about 2%, and the p-channel-type field effect transistor decreases by about 7% per tensile stress of 100 MPa perpendicular to the channel.

Since a film is flatly formed in the actual device circuit, the channel portion of the transistor are subject to the biaxial stress, that is, the stress parallel and perpendicular to the channel. If the stress control film whose film stress is tensile stress is uniformly formed over the circuit, then the channel portion of the transistor is subject to the tensile stress in the parallel and vertical directions.

Since the drain current increases for the tensile stress of the n-channel-type field effect transistor in the parallel and vertical directions, the characteristics can be improved.

However, since the p-channel-type field effect transistor decreases the drain current by the tensile stress parallel to the channel, it is necessary to reduce the tensile stress. However, since the drain current is increased perpendicular to the channel, the effect is to be utilized.

According to the semiconductor device of the present embodiment, the tensile stress parallel to the channel of the p-channel-type field effect transistor can be reduced by removing the stress control film parallel to the channel of the p-channel-type field effect transistor in the stress control film covering the entire circuit. The tensile stress can work in the other directions, that is, parallel to the channel of the n-channel-type field effect transistor, and perpendicular to the channel of the n- and p-channel-type field effect transistors.

Therefore, since the channel face stress is controlled in the biaxial directions for the n- and p-channel-type field effect transistors, the drain currents can be increased for the n-channel type and the p-channel type.

The material of a stress control film can be, for example, silicon nitride according to the first embodiment. Thus, the stress control film can also be used as a film for a self-matching contact for providing a contact hole in the interlayer insulated film mainly of silicon oxide.

In the semiconductor device according to the present embodiment, the stress control film is removed only in the field area enclosed by the active of the p-channel-type field effect transistor. That is, since the stress control film is formed on the portion for connection of the contact plug to the source/drain of the p-channel-type field effect transistor, it can be used as a film for the self-matching contact.

Since the stress control film according to the present embodiment can be processed as in forming a self-matching contact hole, the mask can be shared with the self-matching contact. That is, after the stress control film 209 is uniformly generated, the stress control film treating process (removing the stress control film on the shallow groove device separation 202c and 202b) can be performed simultaneously with the self-matching contact hole forming process. The subsequent processes can be performed with the process of the conventional self-matching contact. Thus, according to the present embodiment, the conventional process can be used only by changing a mask layout. Therefore, the semiconductor device can be obtained at a low production cost.

It is desired that the tensile stress parallel to the channel of the p-channel-type field effect transistor can be the smallest possible. Therefore, it is preferable that the stress control film on the p-channel-type field effect transistor side is formed only on the contact hole forming area, that is, the portion used for the self-matching contact.

It is not always necessary that the slit portion of the stress control film is completely free of film. That is, a thin film can be acceptable.

In other embodiments, a stress control film thinner than the stress control film formed on the semiconductor having the first p-channel-type field effect transistor can be formed on the area (for example, a field area) between the first p-channel-type field effect transistor and the second p-channel-type field effect transistor adjacent to the first p-channel-type field effect transistor, and on the area (for example, a field area) between the first p-channel-type field effect transistor and the first n-channel-type field effect transistor corresponding to the first p-channel-type field effect transistor. Otherwise, the stress control film can be omitted.

On the other hand, a stress reduced layer thinner than the stress reduced layer formed on the semiconductor having the first n-channel-type field effect transistor can be formed on the area (for example, a field area) between the first p-channel-type field effect transistor and the second p-channel-type field effect transistor adjacent to the first p-channel-type field effect transistor, and on the area (for example, a field area) between the first n-channel-type field effect transistor corresponding to the first p-channel-type field effect transistor and the second n-channel-type field effect transistor adjacent to the first n-channel-type field effect transistor and corresponding to the second p-channel-type field effect transistor. Otherwise, the stress reduced layer can be omitted.

A stress control film thinner than the stress control film formed on the semiconductor having the first p-channel-type field effect transistor can be formed on the area (for example, a field area) between the first p-channel-type field effect transistor and the first n-channel-type field effect transistor corresponding to the first p-channel-type field effect transistor. Otherwise, the stress control film can be omitted.

At this time, a stress control film thinner than the stress control film is formed in the field area around the active area of the first n-channel-type field effect transistor corresponding to the first p-channel-type field effect transistor, or can be omitted.

Figure 36:
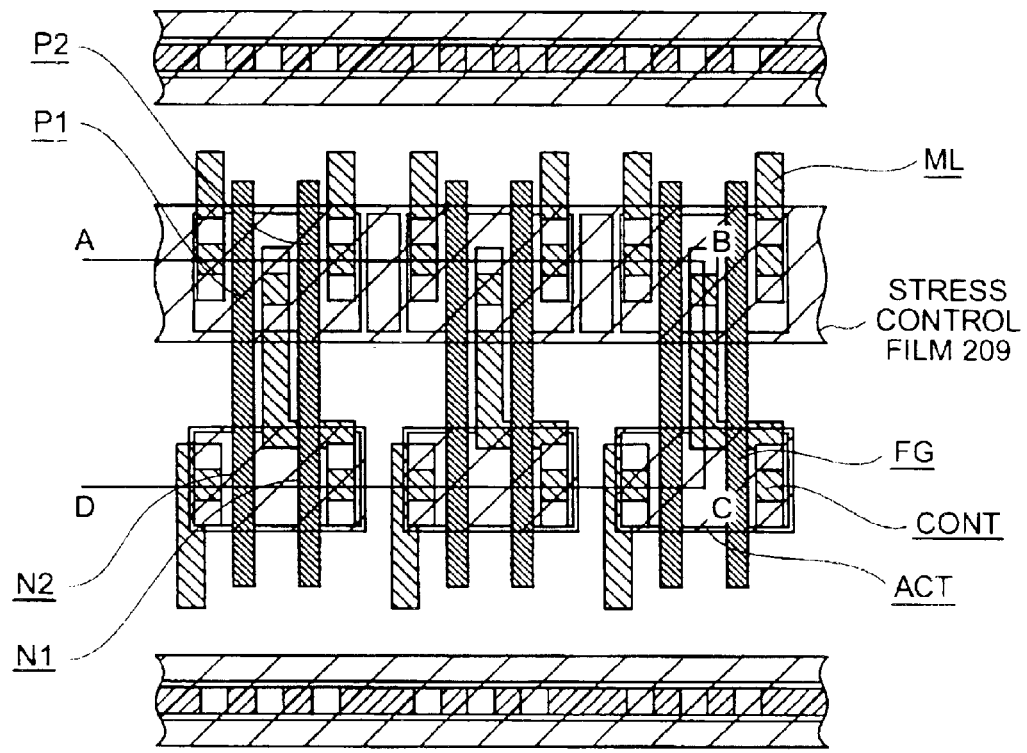
FIG. 36 is a schematic plan view (partially enlarged view of FIG. 37) of an eleventh embodiment of the present invention.
Figure 37:
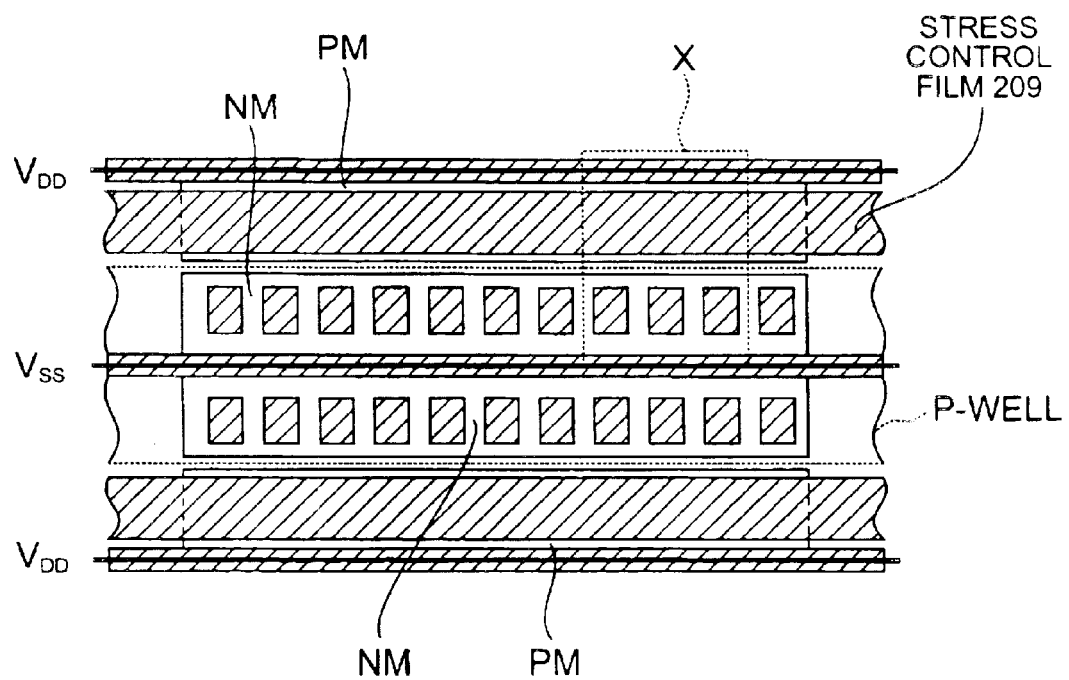
FIG. 37 is a schematic plan view of the eleventh embodiment of the present invention.
Figure 38A:
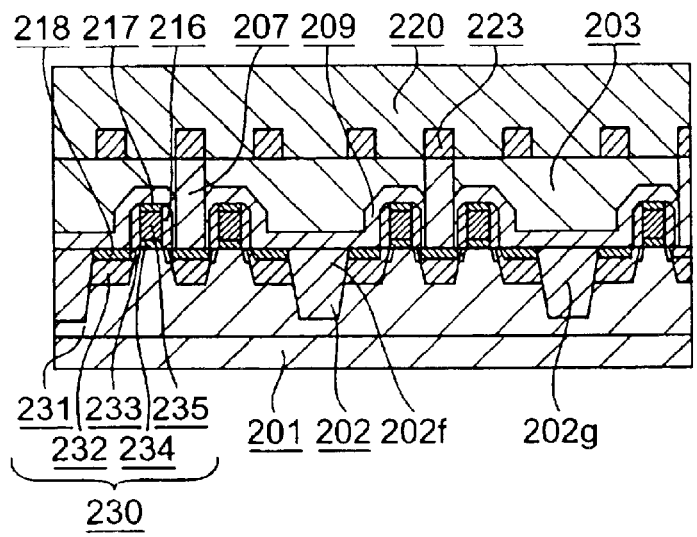
FIGS. 38A, 38B, and 38C are schematic sectional views of the eleventh embodiment of the present invention.
Figure 38B:
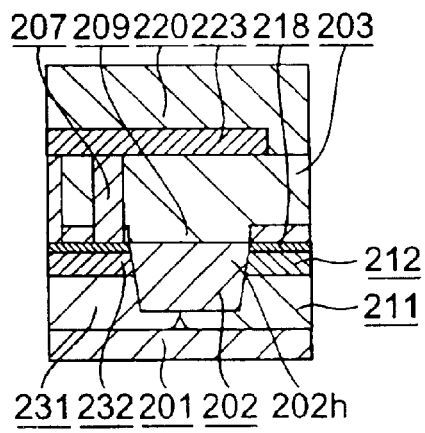
Figure 38C:
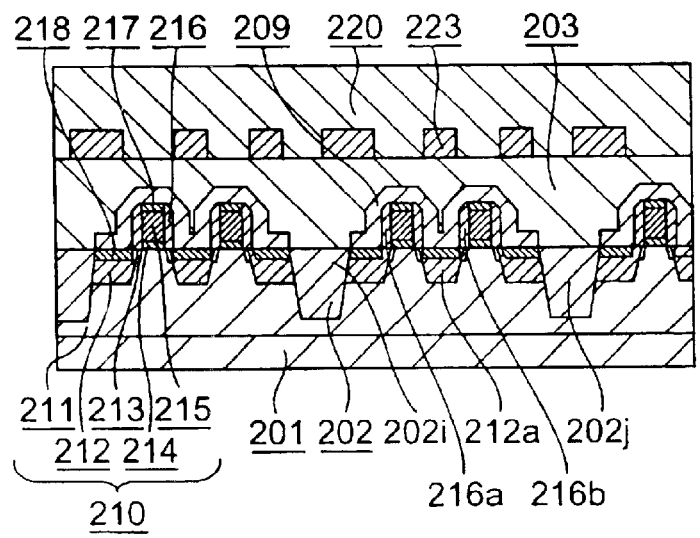

Next, the eleventh embodiment of the present invention will be described below by referring to FIGS. 2, 36 to 38A, 38B, and 38C. The present embodiment is an example to which an actual device circuit is applied with the stress perpendicular to the channel taken into account when the stress control film 9 has compression stress according to the second embodiment. FIG. 2 shows an experiment result of the stress dependence of the drain currents of the n- and p-channel-type field effect transistors. FIGS. 36 and 37 are typical views of the layout in plan views of the semiconductor device according to the present invention (FIG. 36 is a typical view obtained by enlarging a part (around the frame indicated by X) of FIG. 37 of the layout of the plan view of the semiconductor device according to the present invention. FIGS. 38A, 38B, and 38C are typical views of the sectional structure from A to D of the layout in the plan view shown in FIG. 36.

The difference between the present embodiment and the tenth embodiment is that the film stress of the stress control film 209 is compression stress, and they have different areas formed by the stress control film 209.

That is, the semiconductor device according to the present embodiment is characterized in that no film is formed on the field area (shallow groove device separation) adjacent to the active of the p-channel-type field effect transistor and perpendicular to the drain current, and on the field area surrounding the active area of the n-channel-type field effect transistor in the stress control film covering the entire surface of the circuit layout as shown in the typical layout in the plan views shown in FIGS. 36 and 37, or in the typical sectional structure views shown in FIGS. 38A, 38B, and 38C (the stress control film 209 is continuously formed up to the adjacent element in the repetitive direction (parallel to channel) of the p-channel-type field effect transistor, and the stress control film is formed only on the active on the n-channel-type field effect transistor side.)

The transistors other than the stress control film, the wiring ML, and the arrangement of the contact plug CONT are the same as those according to the tenth embodiment.

Described below will be the effect of the present embodiment. Unlike the case according to the tenth embodiment, if the stress control film indicates compression stress, then the stress on the compressive side occurs on the channel portion perpendicular and parallel to the channel. As described above according to the second embodiment by referring to FIG. 14, the stress control film 209 can be formed parallel to the channel discontinuously on the n-channel-type field effect transistor side, and continuously on the p-channel-type field effect transistor side.

On the other hand, the drain current decreases by compression stress perpendicular to the channel with the n- and p-channel-type field effect transistors.

As described above by referring to the tenth embodiment, the stress control film 209 can also be used as a film for a self-matching contact for generation of the contact plug CONT 207.

Therefore, the semiconductor device according to the present embodiment has the stress control film 209 formed on the shallow groove device separation, for example, 202f and 202g parallel to the channel of the p-channel-type field effect transistor as shown in FIG. 38A so that the film can be in series with the stress control film on the adjacent transistor, thereby broadening the area of the stress control film working on the channel portion. On the other hand, perpendicular to the channel, the stress control film 209 is not formed on the shallow-groove device separation 202h as shown in FIG. 38B, thereby minimizing the area of the stress control film working perpendicular to the channel. Therefore, the stress in the compression direction works parallel to the channel, and the effect of the compression stress is suppressed in the vertical direction. As a result, the drain current can be increased.

Since the stress control film indicating compression stress works to reduce the drain current for the n-channel-type field effect transistor. Therefore, it is not necessary to form the stress control film 209.

However, when the stress control film is used as a film for a self-matching contact, the stress control film 209 is formed also on the n-channel-type field effect transistor side as in the present embodiment. At this time, the area in which the stress control film is formed can be formed only in the portion required to generate the contact plug CONT 207, and it is desired not to form the area on the shallow groove device separation, for example, 202*i* and 202*j*. To be more preferable, it is desired not to form a diffusion layer of the two transistors N1 and N2 formed on one active on the side where the contact plug CONT 207 is not formed, for example, the stress control film on the 212*a*, and a side wall, for example, the stress control film adjacent to 216*a* and 216*b*. As described above, the stress control film 209 formed on the n-channel-type field effect transistor side minimizes the decrease in drain current, and can also be used as a film for a self-matching contact. It is desired that the thickness of the stress control film on the n-channel-type field effect transistor side is thinner as described above in the first embodiment.

In the semiconductor device according to the present embodiment, the stress control film can be processed as in the process of forming a self-matching contact hole in the tenth embodiment. Therefore, a mask can be shared with the self-matching contact process. As a result, the semiconductor device can be obtained at a lower production cost.

The semiconductor device according to the present embodiment is an example of explaining the method of controlling the stress perpendicular to the channel using the actual 2NAND circuit. The applicable circuit is not limited to the present embodiment.

The twelfth embodiment of the present invention will be described below by referring to FIGS. 35A, and 39 to 43. In the present embodiment, the production method according to the tenth embodiment is explained by referring to FIG. 35A which is a typical sectional structure according to the tenth embodiment. The eleventh embodiment can be produced in the similar method.

Described below will be the production method according to the present embodiment.

Figure 39:
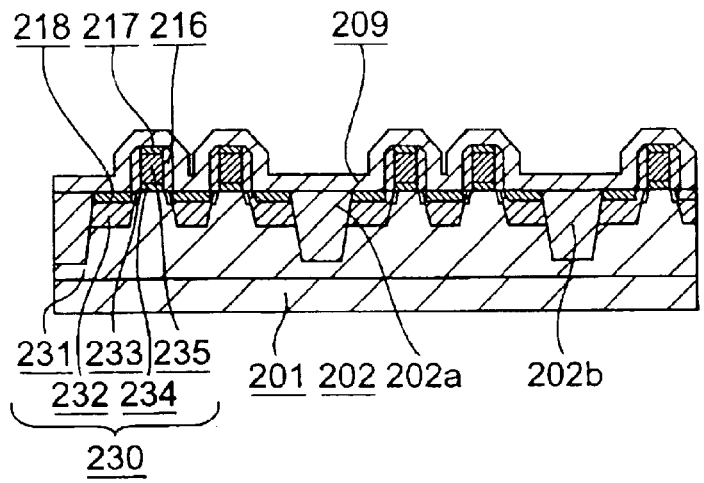
FIG. 39 is a schematic sectional view showing a part of a process of manufacturing the semiconductor device as the tenth embodiment of the present invention.

(1) The field effect transistor 230, the silicide 217, 218, etc. are formed on the silicon substrate 201, and the stress control film 209 is formed on the upper whole surface (FIG. 39).

Figure 40:
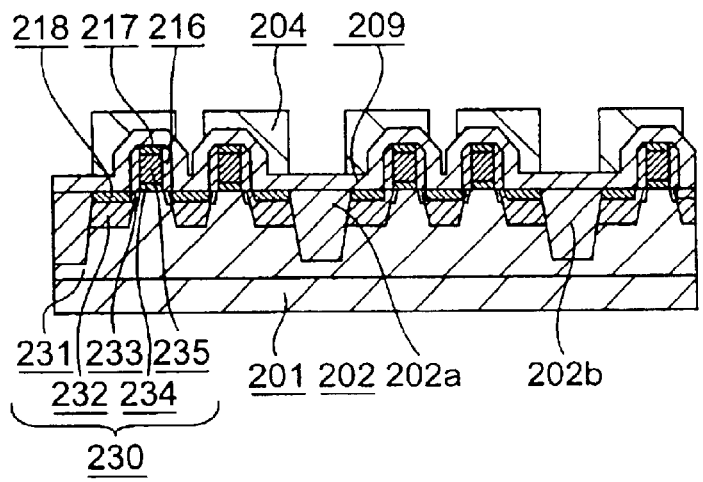
FIG. 40 is a schematic sectional view showing a part of the process of manufacturing the semiconductor device as the tenth embodiment of the present invention.

(2) A mask 204 is formed on the upper surface of the stress control film 209 for processing the stress control film 209. The mask pattern can be used for process of stress control and for process of forming the contact plug 207 (FIG. 40).

Figure 41:
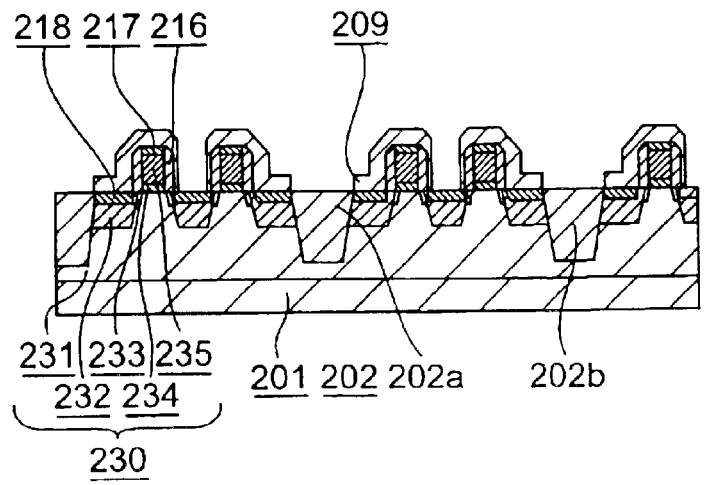
FIG. 41 is a schematic sectional view showing a part of the process of manufacturing the semiconductor device as the tenth embodiment of the present invention.

(3) The stress control film 209 is processed by etching (FIG. 41).

Figure 42:
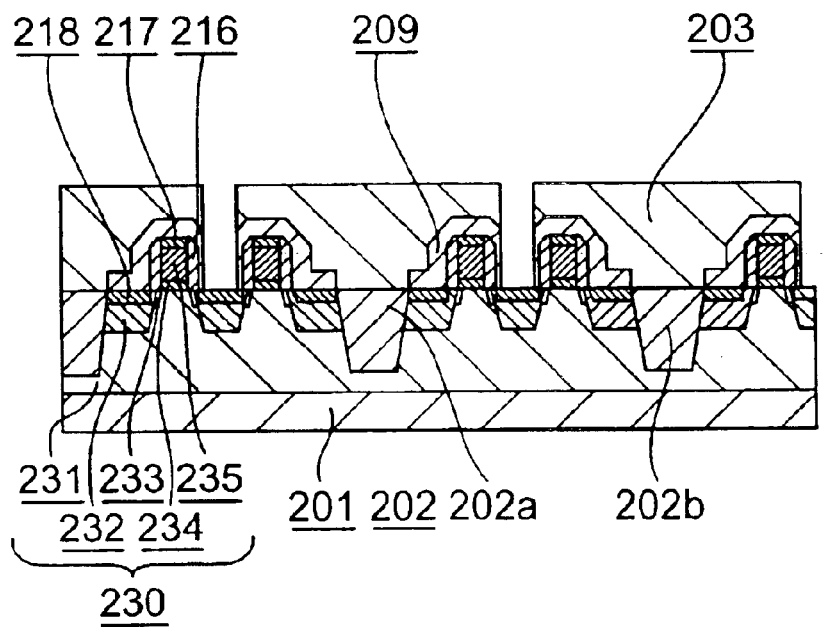
FIG. 42 is a schematic sectional view showing a part of the process of manufacturing the semiconductor device as the tenth embodiment of the present invention.

(4) The interlayer insulated film 203 is formed, and a hole is made only in the portion of the contact plug 207 (FIG. 42).

Figure 43:
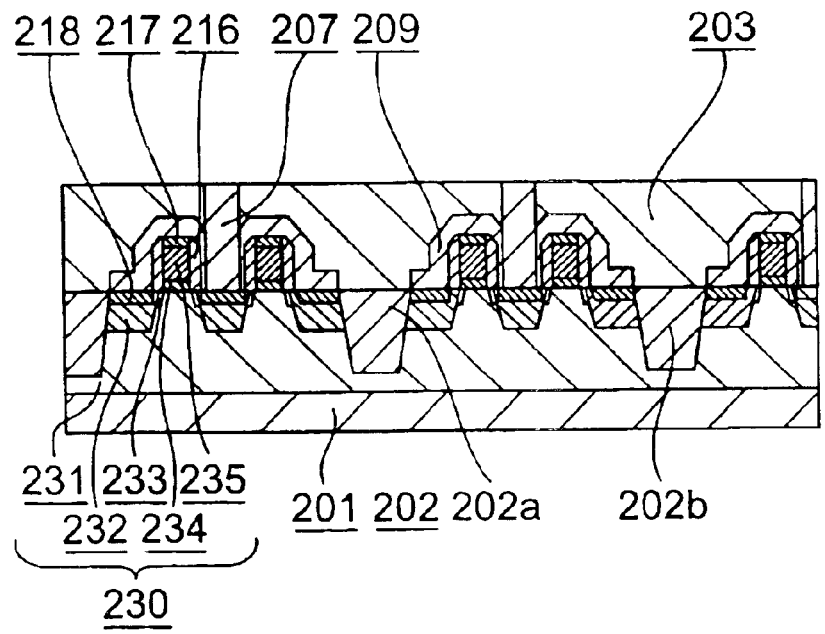
FIG. 43 is a schematic sectional view showing a part of the process of manufacturing the semiconductor device as the tenth embodiment of the present invention.

(5) The contact plug 207 if formed (FIG. 43).

(6) The wiring 223 for an upper layer, the interlayer insulated film 220, etc. are formed (FIG. 35).

According to the present embodiment, the stress control process of the stress control film 209 and the self-matching contact process for forming a contact plug can be simultaneously performed using the same mask. Therefore, a reliable semiconductor device can be obtained at a low production cost.

The production method according to the present embodiment is an example of the method of producing the tenth embodiment of the present-invention. The production methods according to the tenth and eleventh embodiments can be any methods according to other embodiments than the present embodiment.

INDUSTRIAL APPLICABILITY

In a semiconductor device including n-channel field effect transistors and p-channel field effect transistors, drain current characteristic of the n-channel field effect transistors and the p-channel field effect transistors is improved to realize a semiconductor device which is excellent in industrial applicability.

What is claimed is:

1. A semiconductor device comprising an n-channel field effect transistor and a p-channel field effect transistor both formed on a substrate,
    wherein said transistors each comprise an insulated film wrapping a gate electrode and extending to a location adjacent to a source/drain area, and said insulated film is mainly composed of silicon nitride, and the thickness of said insulated film of said n-channel field effect transistor differs from the thickness of said insulated film of said p-channel field effect transistor.

2. The semiconductor device according to claim 1,
    wherein said insulated film is mainly composed of silicon nitride, and the size of an area extending adjacent to a source/drain area of said insulated film is different between said insulated film of said n-channel field effect transistor and said insulated film of said p-channel field effect transistors.

3. The semiconductor device according to claim 1,
    wherein said insulated film is each mainly composed of silicon nitride, and an etching rate for said insulated film of said n-channel field effect transistor is different from that for said insulated film of said p-channel field effect transistor.

4. The semiconductor device according to claim 1, characterized in that said insulated film is mainly composed of silicon nitride.

5. A semiconductor device comprising: an n-channel field effect transistor; and a p-channel field effect transistor both formed on a substrate,
    wherein a gate electrode of said n-channel field effect transistor is formed to undergo higher compression film stress than that of said p-channel field effect transistor.

6. A semiconductor device comprising: an n-channel field effect transistor; and a p-channel field effect transistor both formed on a substrate,
    wherein impurities contained in a gate electrode of said n-channel field effect transistor have a concentration gradient in a perpendicular direction in a main plane of said silicon substrate, and impurities contained in a gate electrode of said p-channel field effect transistor have no concentration gradient in said perpendicular direction in said main plane of said silicon substrate within measurement limits or have a smaller concentration gradient than those in said gate electrode of said n-channel field effect transistor.

7. A semiconductor device comprising: an n-channel field effect transistor; and a p-channel field effect transistor both formed on a substrate,
    wherein said gate electrode of said n-channel field effect transistor has a smaller average crystal particle size than that of said p-channel field effect transistor.

8. A semiconductor device comprising: an n-channel field effect transistor; a p-channel field effect transistor; and element separating means for electrically separating adjacent transistor elements from each other, said n- and p-channel field effect transistor and said element separating means all being formed on a substrate, wherein the distance between a channel portion of said n-channel field effect transistor and said element separating means is larger than that between a channel portion of said p-channel field effect transistor and said element separating means.

9. A semiconductor device comprising: an n-channel field effect transistor; and a p-channel field effect transistor both formed on a substrate, wherein a Raman shift in a Raman spectrum obtained when a channel portion of said n-channel field effect transistor is irradiated with laser beams is smaller than that obtained when a channel portion of said p-channel field effect transistor is irradiated with laser beams.

10. A semiconductor device comprising an n-channel field effect transistor and a p-channel field effect transistor both formed on a substrate, wherein said transistors each have a silicide area formed in a source or drain area, and said silicide area of said n-channel field effect transistor is thicker than that of said p-channel field effect transistor.

11. The semiconductor device according to claim 10, wherein said suicide area is mainly composed of cobalt suicide ($COSi_2$), titanium suicide ($TiSi2$), or nickel silicide.

12. A semiconductor device comprising an n-channel field effect transistor and a p-channel field effect transistor both formed on a substrate, wherein if tensile stress acts on an insulated film wrapping a gate electrode of each of said transistors and extending to an area adjacent to a source/drain area, then in a potion of said insulated film which is adjacent to the longitudinal side of the gate electrode, the p-channel field effect transistor has a smaller Young's modulus than the n-channel field effect transistor, and if compression stress acts on said insulated film wrapping said gate electrode of each of said transistors and extending to said area adjacent to said source/drain area, then in a portion of said insulated film which is adjacent to the longitudinal side of the gate electrode, the p-channel field effect transistor has a larger Young's modulus than the n-channel fiefd effect transistor.

13. The semiconductor device according to claim 12, wherein a material of the insulated material located adjacent to the longitudinal side of the gate electrode and having a large Young's modulus is mainly composed of silicon nitride, and a material of the insulated material located adjacent to the longitudinal side of the gate electrode and having a small Young's modulus is mainly composed of silicon oxide.

14. A semiconductor device comprising an n-channel field effect transistor and a p-channel field effect transistor both formed on a substrate, wherein:

said n-channel field effect transistor includes a plurality of n-channel field effect transistors and said p-channel field effect transistor includes a plurality of p-channel field effect transistors, an insulated film undergoing tensile stress is formed on said n-channel field effect transistors and said p-channel field effect transistors, and a portion of said insulated film which is thinner than a portion of said insulated film which is formed on a first p-channel field effect transistor or a second p-channel field effect transistor adjacent to said first p-channel field effect transistor is formed between said first p-channel field effect transistor and said second p-channel field effect transistor, or said insulated film is not installed on said first p-channel field effect transistor or said second p-channel field effect transistor.

15. A semiconductor device comprising an n-channel field effect transistor and a p-channel field effect transistor bath formed on a substrate, wherein:

said n-channel field effect transistor includes a plurality of n-channel field effect transistors and said p-channel field effect transistor includes a plurality of p-channel field effect transistors, an insulated film undergoing tensile stress is formed on said n-channel field effect transistors and said p-channel field effect transistors, and a portion of said insulated film which is thinner than a portion of said insulated film which is formed in an area located between a first n-channel field effect transistor and a second n-channel field effect transistor is formed in an area located between a first p-channel field effect transistor and a second p-channel field effect transistor adjacent to said first p-channel field effect transistor, said first n-channel field effect transistor corresponding to said first p-channel field effect transistor, said second n-channel field effect transistor corresponding to said second p-channel field effect transistor, or said insulated film is not formed in said area located between said first p-channel field effect transistor and said second p-channel field effect transistor.

16. A semiconductor device comprising an n-channel field effect transistor and a p-channel field effect transistor both formed on a substrate, wherein:

said n-channel field effect transistor includes a plurality of n-channel field effect transistors and said p-channel field effect transistor includes a plurality of p-channel field effect transistors, an insulated film undergoing compression stress is formed on said n-channel field effect transistors and said p-channel field effect transistors, and a portion of said insulated film which is thinner than a portion of said insulated film which is formed in an area located between a first p-channel field effect transistor and a second p-channel field effect transistor adjacent to said first p-channel field effect transistor is formed in an area located between a first n-channel field effect transistor corresponding to said first p-channel field effect transistor and a second n-channel field effect transistor corresponding to said second p-channel field effect transistor, or said insulated film is not formed in said area located between said first n-channel field effect transistor and said second n-channel field effect transistor.

* * * * *

UNITED STATES PATENT AND TRADEMARK OFFICE
CERTIFICATE OF CORRECTION

PATENT NO.     : 6,982,465 B2
DATED          : January 3, 2006
INVENTOR(S)    : Y. Kumagai et al.

It is certified that error appears in the above-identified patent and that said Letters Patent is hereby corrected as shown below:

<u>Title page,</u>
Item [56], References Cited, U.S. PATENT DOCUMENTS, insert the following:
-- 6,876,053 B1 *        4/2005          Ma, et al.        257/500 --.

<u>Column 34, line 15 - Column 36, line 60,</u>
Replace claims with the following:

1. A semiconductor device comprising an n-channel field effect transistor and a p-channel field effect transistor both formed on a substrate,
  wherein said transistors each comprise an insulated film wrapping a gate electrode and extending to a location adjacent to a source/drain area, and said insulated film is mainly composed of silicon nitride, and the thickness of said insulated film of said n-channel field effect transistor differs from the thickness of said insulated film of said p-channel field effect transistor such that, when a tensile stress is applied to the insulating films, the thickness of the insulating film of the p-channel field effect transistor is smaller than the thickness of the insulating film of the n-channel field effect transistor, and when a compression stress is applied to the insulating films, the thickness of the insulating film of the n-channel field effect transistor is smaller than the thickness of the insulating film of the p-channel field effect transistor.

2. The semiconductor device according to Claim 1,
  wherein said insulated film is mainly composed of silicon nitride, and the size of an area extending adjacent to a source/drain area of said insulated film is different between said insulated film of said n-channel field effect transistor and said insulated film of said p-channel field effect transistors.

3. The semiconductor device according to Claim 1,
  wherein said insulated film is each mainly composed of silicon nitride, and an etching rate for said insulated film of said n-channel field effect transistor is different from that for said insulated film of said p-channel field effect transistor.

4. The semiconductor device according to Claim 1,
  characterized in that said insulated film is mainly composed of silicon nitride.

5. A semiconductor device comprising an n-channel field effect transistor and a p-channel field effect transistor both formed on a substrate,
  wherein said transistors each have a silicide area formed in a source or drain area, and said silicide area of said n-channel field effect transistor is thicker than that of said p-channel field effect transistor.

6. The semiconductor device according to Claim 5,
  wherein said silicide area is mainly composed of cobalt silicide ($COSi_2$), titanium silicide ($TiSi_2$), or nickel silicide.

7. A semiconductor device comprising: an n-channel field effect transistor; and a p-channel field effect transistor both formed on a substrate,
  wherein a gate electrode of said n-channel field effect transistor is formed to undergo higher compression film stress than that of said p-channel field effect transistor.

UNITED STATES PATENT AND TRADEMARK OFFICE
CERTIFICATE OF CORRECTION

PATENT NO.    : 6,982,465 B2
DATED         : January 3, 2006
INVENTOR(S)   : Y. Kumagai et al.

It is certified that error appears in the above-identified patent and that said Letters Patent is hereby corrected as shown below:

Column 34, line 15 - Column 36, line 60 (cont'd),

8. A semiconductor device comprising: an n-channel field effect transistor; and a p-channel field effect transistor both formed on a substrate,
    wherein impurities contained in a gate electrode of said n-channel field effect transistor have a concentration gradient in a perpendicular direction in a main plane of said silicon substrate, and impurities contained in a gate electrode of said p-channel field effect transistor have no concentration gradient in said perpendicular direction in said main plane of said silicon substrate within measurement limits or have a smaller concentration gradient than those in said gate electrode of said n-channel field effect transistor.

9. A semiconductor device comprising: an n-channel field effect transistor; a p-channel field effect transistor; and element separating means for electrically separating adjacent transistor elements from each other, said n- and p-channel field effect transistor and said element separating means all being formed on a substrate,
    wherein the distance between a channel portion of said n-channel field effect transistor and said element separating means is larger than that between a channel portion of said p-channel field effect transistor and said element separating means.

10. A semiconductor device comprising an n-channel field effect transistor and a p-channel field effect transistor both formed on a substrate,
    wherein if tensile stress acts on an insulated film wrapping a gate electrode of each of said transistors and extending to an area adjacent to a source/drain area, then in a potion of said insulated film which is adjacent to the longitudinal side of the gate electrode, the p-channel field effect transistor has a smaller Young's modulus than the n-channel field effect transistor, and
    if compression stress acts on said insulated film wrapping said gate electrode of each of said transistors and extending to said area adjacent to said source/drain area, then in a portion of said insulated film which is adjacent to the longitudinal side of the gate electrode, the p-channel field effect transistor has a larger Young's modulus than the n-channel field effect transistor.

11. The semiconductor device according to Claim 10,
    wherein a material of the insulated material located adjacent to the longitudinal side of the gate electrode and having a large Young's modulus is mainly composed of silicon nitride, and a material of the insulated material located adjacent to the longitudinal side of the gate electrode and having a small Young's modulus is mainly composed of silicon oxide.

12. A semiconductor device comprising an n-channel field effect transistor and a p-channel field effect transistor both formed on a substrate,
    wherein:
    said n-channel field effect transistor includes a plurality of n-channel field effect transistors and said p-channel field effect transistor includes a plurality of p-channel field effect transistors,
    an insulated film undergoing tensile stress is formed on said n-channel field effect transistors and said p-channel field effect transistors, and

UNITED STATES PATENT AND TRADEMARK OFFICE
CERTIFICATE OF CORRECTION

PATENT NO. : 6,982,465 B2
DATED : January 3, 2006
INVENTOR(S) : Y. Kumagai et al.

It is certified that error appears in the above-identified patent and that said Letters Patent is hereby corrected as shown below:

Column 34, line 15 - Column 36, line 60 (cont'd), a portion of said insulated film which is thinner than a portion of said insulated film which is formed on a first p-channel field effect transistor or a second p-channel field effect transistor adjacent to said first p-channel field effect transistor is formed between said first p-channel field effect transistor and said second p-channel field effect transistor, or said insulated film is not installed on said first p-channel field effect transistor or said second p-channel field effect transistor.

13. A semiconductor device comprising an n-channel field effect transistor and a p-channel field effect transistor both formed on a substrate,
wherein:
said n-channel field effect transistor includes a plurality of n-channel field effect transistors and said p-channel field effect transistor includes a plurality of p-channel field effect transistors,
an insulated film undergoing tensile stress is formed on said n-channel field effect transistors and said p-channel field effect transistors, and
a portion of said insulated film which is thinner than a portion of said insulated film which is formed in an area located between a first n-channel field effect transistor and a second n-channel field effect transistor is formed in an area located between a first p-channel field effect transistor and a second p-channel field effect transistor adjacent to said first p-channel field effect transistor, said first n-channel field effect transistor corresponding to said first p-channel field effect transistor, said second n-channel field effect transistor corresponding to said second p-channel field effect transistor, or said insulated film is not formed in said area located between said first p-channel field effect transistor and said second p-channel field effect transistor.

14. A semiconductor device comprising an n-channel field effect transistor and a p-channel field effect transistor both formed on a substrate,
wherein:
said n-channel field effect transistor includes a plurality of n-channel field effect transistors and said p-channel field effect transistor includes a plurality of p-channel field effect transistors,
an insulated film undergoing compression stress is formed on said n-channel field effect transistors and said p-channel field effect transistors, and

UNITED STATES PATENT AND TRADEMARK OFFICE
CERTIFICATE OF CORRECTION

PATENT NO. : 6,982,465 B2
DATED : January 3, 2006
INVENTOR(S) : Y. Kumagai et al.

It is certified that error appears in the above-identified patent and that said Letters Patent is hereby corrected as shown below:

<u>Column 34, line 15 - Column 36, line 60 (cont'd),</u> a portion of said insulated film which is thinner than a portion of said insulated film which is formed in an area located between a first p-channel field effect transistor and a second p-channel field effect transistor adjacent to said first p-channel field effect transistor is formed in an area located between a first n-channel field effect transistor corresponding to said first p-channel field effect transistor and a second n-channel field effect transistor corresponding to said second p-channel field effect transistor, or said insulated film is not formed in said area located between said first n-channel field effect transistor and said second n-channel field effect transistor.

Signed and Sealed this

Twenty-fifth Day of April, 2006

JON W. DUDAS
*Director of the United States Patent and Trademark Office*